US012733524B2

(12) United States Patent
Yu et al.

(10) Patent No.: US 12,733,524 B2
(45) Date of Patent: Sep. 8, 2026

(54) ELECTRONIC DEVICE

(71) Applicant: Advanced Semiconductor Engineering, Inc., Kaohsiung (TW)

(72) Inventors: Chung Ju Yu, Kaohsiung (TW); Shao Lun Yang, Kaohsiung (TW); Tsung-Wei Lu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 337 days.

(21) Appl. No.: 18/622,790

(22) Filed: Mar. 29, 2024

(65) Prior Publication Data

US 2025/0309085 A1 Oct. 2, 2025

(51) Int. Cl.

| | |
|---|---|
| ***H10W 70/65*** | (2026.01) |
| ***H10W 72/00*** | (2026.01) |
| ***H10W 72/20*** | (2026.01) |
| ***H10W 90/00*** | (2026.01) |

(52) U.S. Cl.

CPC ........... *H10W 70/65* (2026.01); *H10W 90/00* (2026.01); *H10W 72/07253* (2026.01); *H10W 72/234* (2026.01); *H10W 72/287* (2026.01); *H10W 90/724* (2026.01)

(58) Field of Classification Search

CPC ................. H10W 70/65; H10W 90/00; H10W 72/07253; H10W 72/287; H10W 72/234; H10W 90/724

See application file for complete search history.

(56) References Cited

U.S. PATENT DOCUMENTS

| | | | | |
|---|---|---|---|---|
| 6,405,920 | B1 | 6/2002 | Brunner et al. | |
| 7,553,750 | B2 | 6/2009 | Shih | |
| 7,696,623 | B2 | 4/2010 | Tsai et al. | |
| 11,482,502 | B2 * | 10/2022 | Niwa | H10W 74/15 |
| 2024/0006449 | A1 * | 1/2024 | Fujimagari | H10F 39/811 |
| 2025/0293129 | A1 * | 9/2025 | Murakami | H05K 5/0278 |
| 2025/0316604 | A1 * | 10/2025 | Chang | H10W 70/611 |

FOREIGN PATENT DOCUMENTS

| | | |
|---|---|---|
| TW | I278081 B | 4/2007 |
| TW | I301740 B | 10/2008 |

* cited by examiner

*Primary Examiner* — Christine A Enad

(74) *Attorney, Agent, or Firm* — Foley & Lardner LLP

(57) ABSTRACT

An electronic device is provided. The electronic device includes a substrate, a first pad, and a second pad. The substrate defines a trench extending along a first direction. The first pad is disposed adjacent to the trench. The second pad is disposed next to the first pad. The first pad and the second pad are disposed at a same side of the trench and are arranged along the first direction. The first pad and the second pad define a first gap and a second gap therebetween along the first direction. The first gap is closer to the trench than the second gap is. A width of the first gap along the first direction is greater than a width of the second gap along the first direction.

20 Claims, 34 Drawing Sheets

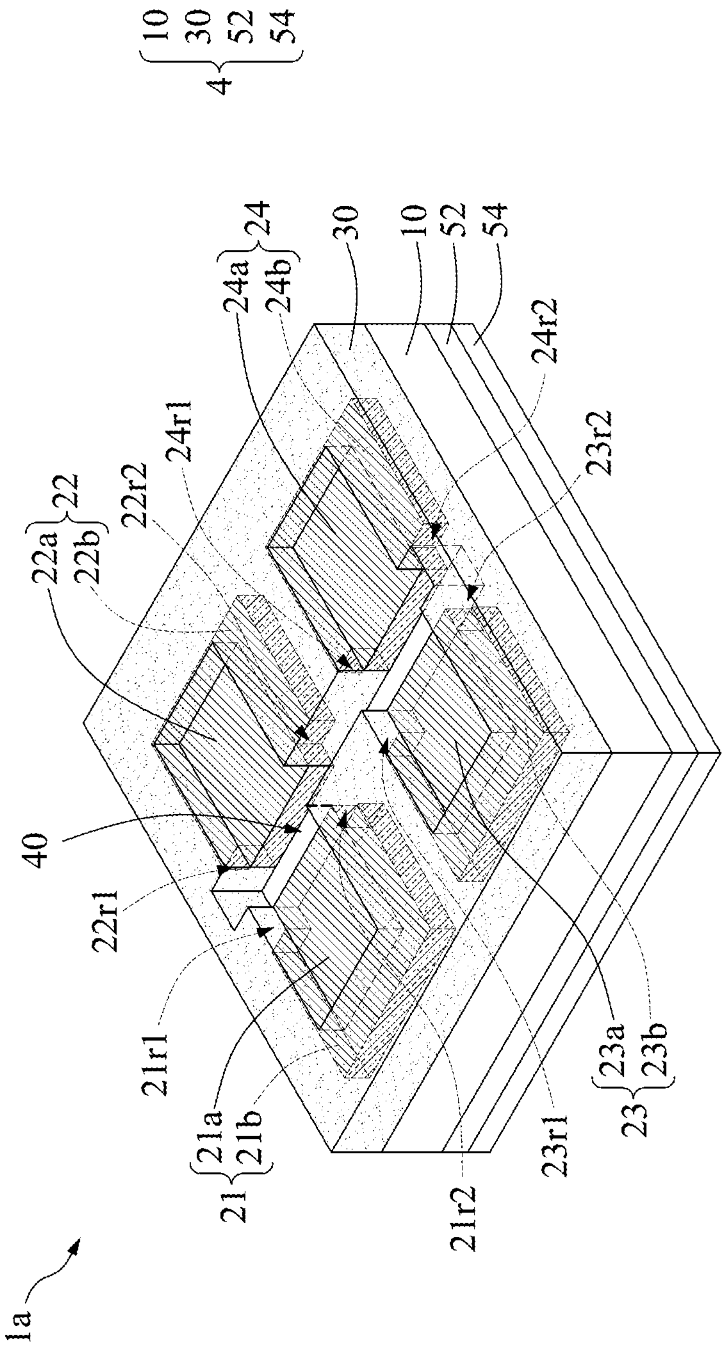
FIG. 1A

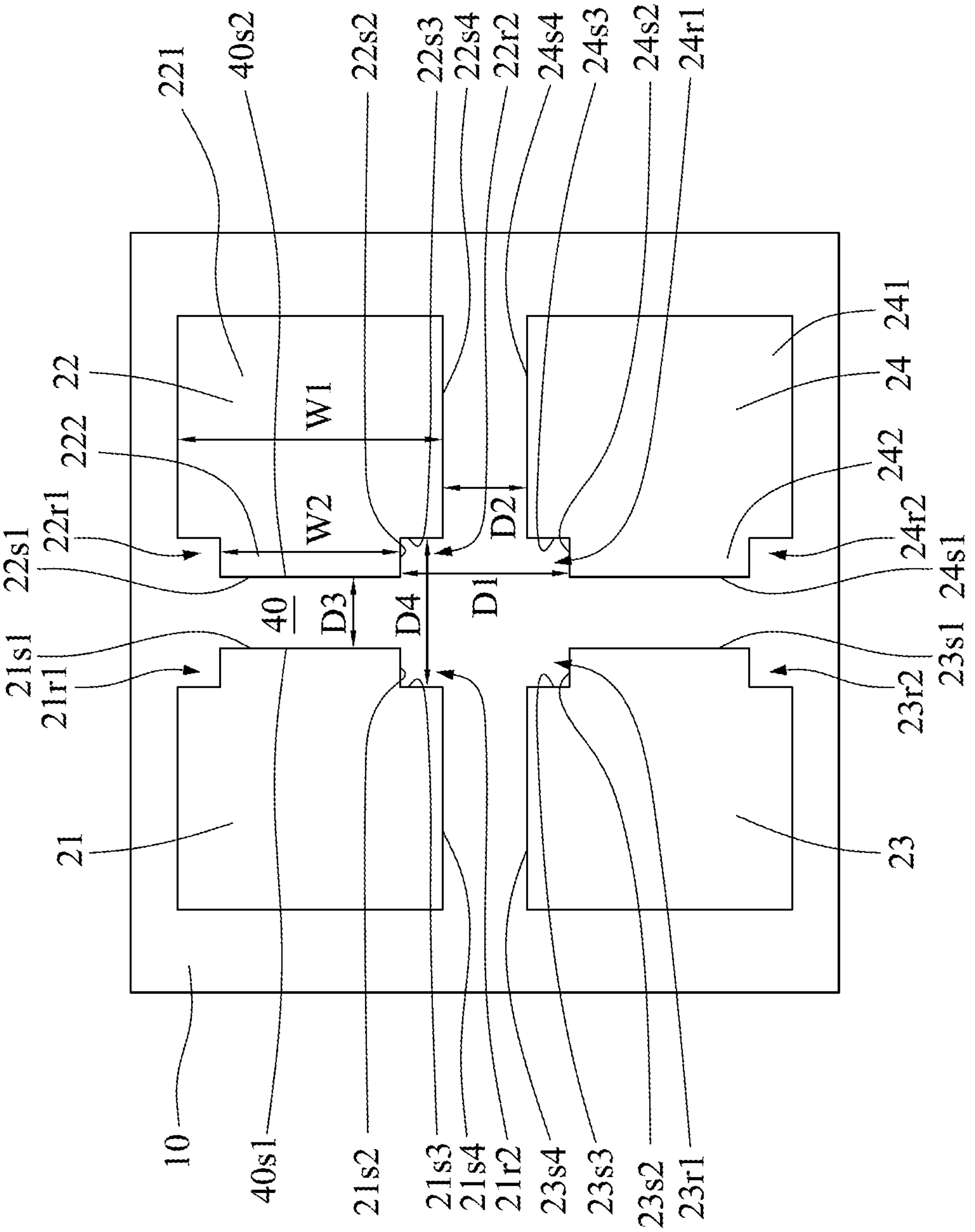
FIG. 1D
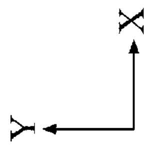

1b
30t1
30t2
30
10s2
10
52
54
24s2
24r1
24
24s3
24s4
22s4
22r2
22s3
22s2
22
24r2
24s1
23r2
23s1
23s2
23s3
22s1
22r1
21s1
21r1
21
21s2
21r2
21s3
21s4
23r1
23s4
23
X
Y

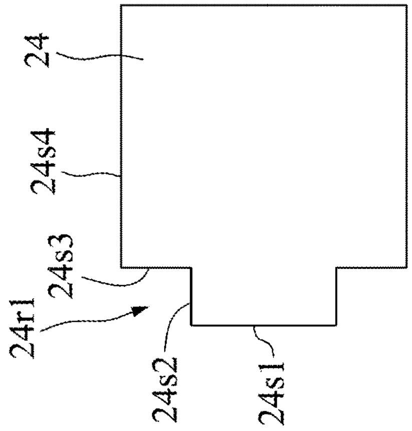
FIG. 3A
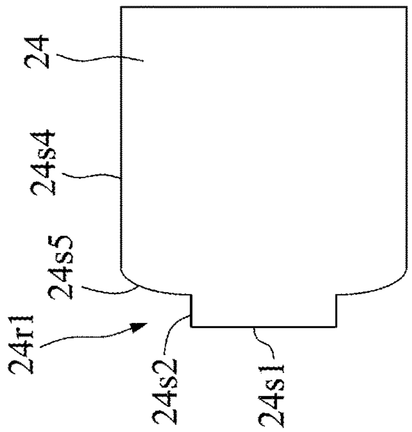
FIG. 3B
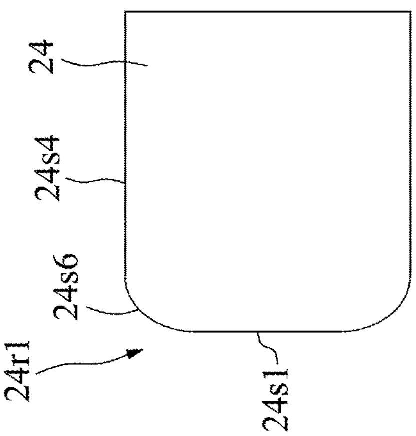
FIG. 3C
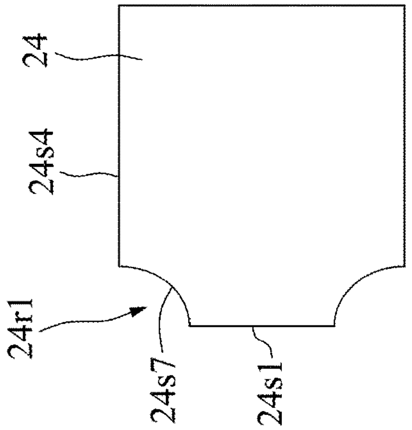
FIG. 3D
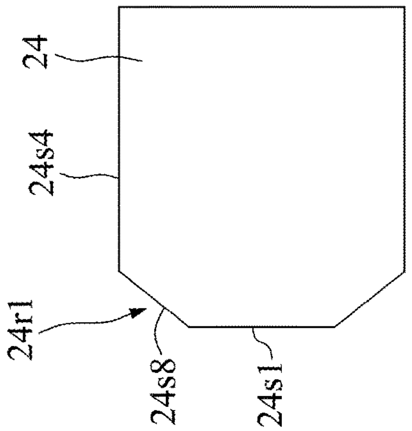
FIG. 3E
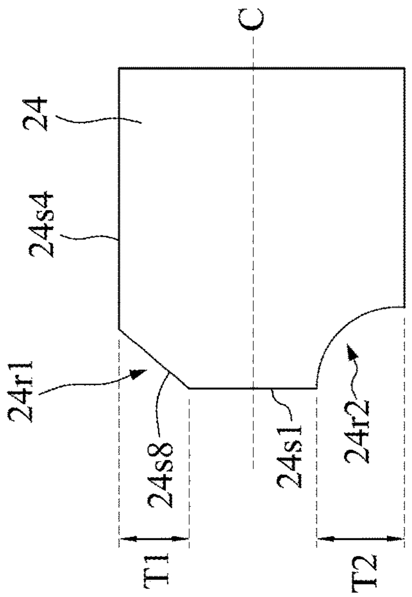
FIG. 3F
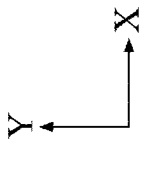

1f
30
42
44
42s1
42s2
21
21a
21b
21s1
21r1
21s2
21s3
21s4
21r2
22
22a
22b
22s1
22r1
22s2
22s3
22s4
22r2
23
23s1
23s2
23s3
23s4
23r1
23s5
23s6
23s7
23r2
24
24s1
24s2
24s3
24s4
24r1
24s5
24s6
24s7
24r2
25
25r1
25s1
25s2
25s3
25s4
25r2
26
26s1
26s2
26s3
26s4
26r2
25r1
44s1
44s2
X
Y

ELECTRONIC DEVICE

BACKGROUND

1. Field of the Disclosure

The present disclosure relates to an electronic device, in particularly to an electronic device including a pad with an indentation(s).

2. Description of the Related Art

Due to the miniaturization of electronic devices, the gap between pads is decreasing. This can result in a bridging between electrical connectors due to the shifting pattern of an insulation layer and excessive solder materials. Additionally, the sidewalls of the molding trench are not protected by the insulation layer, allowing solder materials to overflow into the trench and cause bridging of electrical connectors. Hence, a new electronic device is required.

SUMMARY

In some embodiments, an electronic device includes a substrate, a first pad, and a second pad. The substrate defines a trench extending along a first direction. The first pad is disposed adjacent to the trench. The second pad is disposed next to the first pad. The first pad and the second pad are disposed at a same side of the trench and are arranged along the first direction. The first pad and the second pad define a first gap and a second gap therebetween along the first direction. The first gap is closer to the trench than the second gap is. A width of the first gap along the first direction is greater than a width of the second gap along the first direction.

In some embodiments, an electronic device includes a substrate, a first pad, a second pad, and a first barrier structure. The substrate defines a trench extending along a first direction. The first pad is disposed adjacent to the trench. The second pad is disposed next to the first pad. The first pad and the second pad are disposed at a first side of the trench. The first barrier structure is defined by a plurality of abutting edges of the first pad and configured to block a flowing path, in a bleeding direction from the first pad to the second pad, of a reflowable conductive material. The first barrier structure overlaps the first pad along a direction substantially perpendicular to the bleeding direction in a top view.

In some embodiments, an electronic device includes a substrate, a first terminal, a second terminal, a first reflowable material, and a second reflowable material. The substrate defines a trench extending along a first direction. The first terminal abuts the trench. The second terminal is disposed next to the first terminal. The first terminal and the second terminal are disposed at a same side of the trench and are arranged along the first direction. The first terminal and the second terminal define a first gap and a second gap therebetween along the first direction. The first gap is closer to the trench than the second gap is. The first reflowable material is on a lateral surface, extending along the first direction, of the first terminal. The second reflowable material is on a lateral surface, extending along the first direction, of the second terminal. A distance between the first reflowable material and the second reflowable material ranges between a width of the first gap and a width of the second gap along the first direction.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

FIG. 1A is a perspective view of an electronic device, in accordance with an embodiment of the present disclosure.

FIG. 1D is a top view of the electronic device as shown in FIG. 1A, wherein an insulation layer as shown is omitted, in accordance with an embodiment of the present disclosure.

FIG. 3A is a top view of a pad, in accordance with an embodiment of the present disclosure.

FIG. 3B is a top view of a pad, in accordance with an embodiment of the present disclosure.

FIG. 3C is a top view of a pad, in accordance with an embodiment of the present disclosure.

FIG. 3D is a top view of a pad, in accordance with an embodiment of the present disclosure.

FIG. 3E is a top view of a pad, in accordance with an embodiment of the present disclosure.

FIG. 3F is a top view of a pad, in accordance with an embodiment of the present disclosure.

Figure 1B:
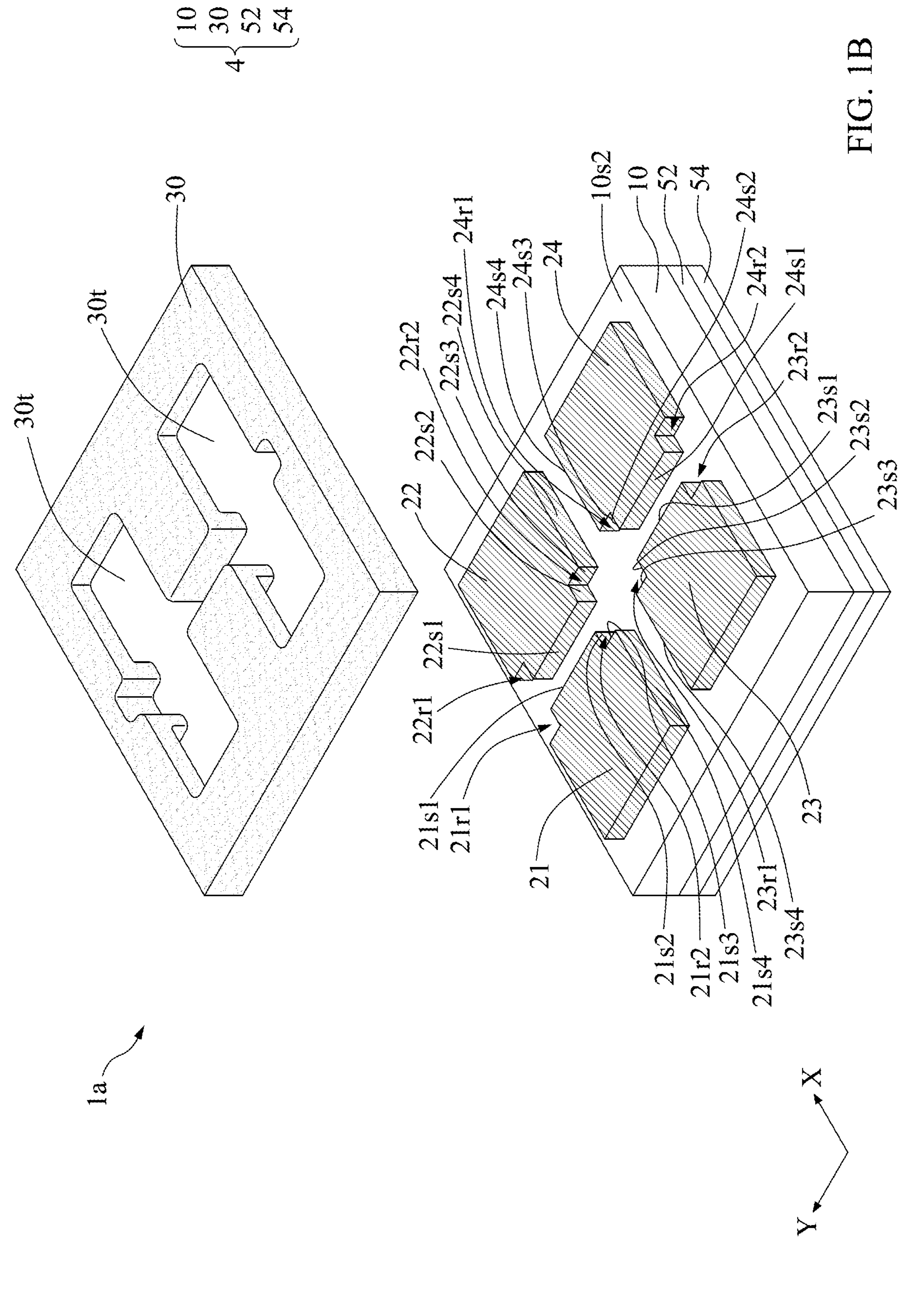
FIG. 1B is an exploded view of an electronic device as shown in FIG. 1A, in accordance with an embodiment of the present disclosure.

Common reference numerals are used throughout the drawings and the detailed description to indicate the same or similar components. Embodiments of the present disclosure will be readily understood from the following detailed description taken in conjunction with the accompanying drawings.

DETAILED DESCRIPTION

The following disclosure provides many different arrangements, or examples, for implementing different features of the provided subject matter. Specific examples of components and arrangements are described as follows. These are, of course, merely examples and are not intended to be limiting. In the present disclosure, reference to the formation or disposal of a first feature over or on a second feature in the description that follows may include arrangements in which the first and second features are formed or disposed in direct contact, and may also include arrangements in which one or more additional features may be formed or disposed between the first and second features, such that the first and second features may not be in direct contact. In addition, the present disclosure may repeat reference numerals and/or letters in the various examples. The same reference numerals and/or letters refer to the same or similar parts. This repetition is for the purpose of simplicity and clarity and does not in itself dictate a relationship between the various arrangements and/or configurations.

Arrangements of the present disclosure are discussed in detail as follows. It should be appreciated, however, that the present disclosure provides many applicable concepts that can be embodied in a wide variety of specific contexts. The specific arrangements discussed are merely illustrative and do not limit the scope of the disclosure.

Figure 1C:
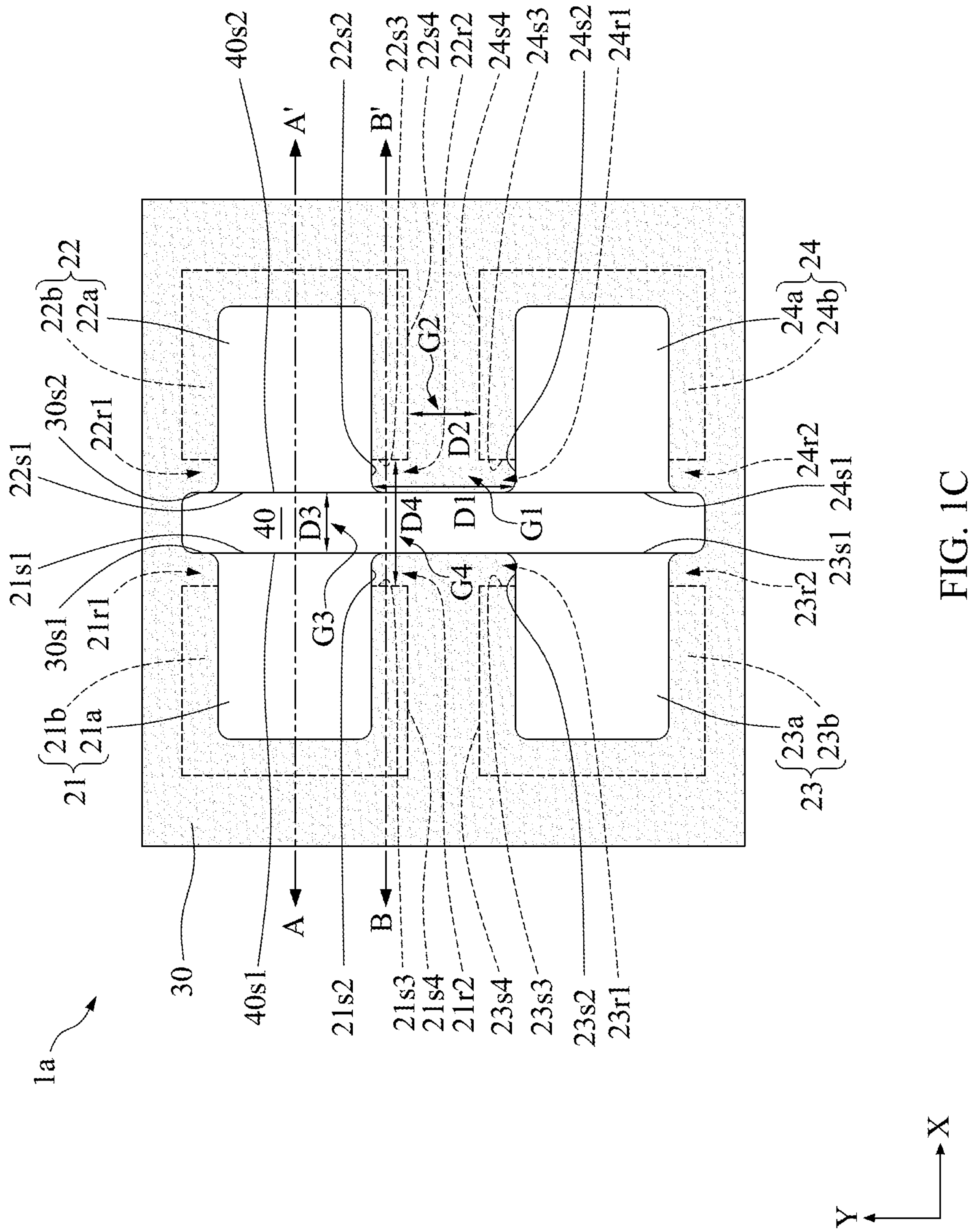
FIG. 1C is a top view of the electronic device as shown in FIG. 1A, in accordance with an embodiment of the present disclosure.
Figure 1E:
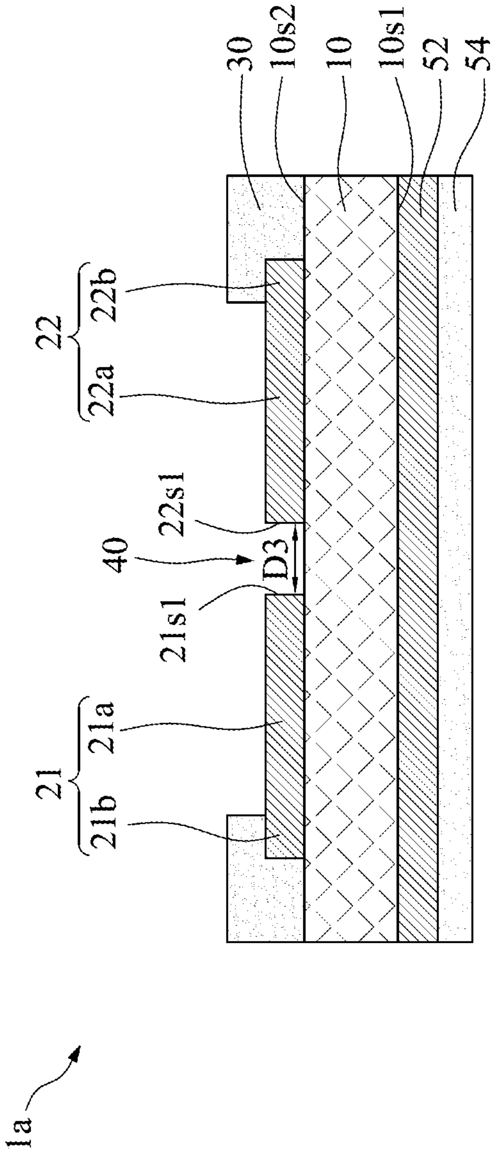
FIG. 1E is a cross-sectional view along line A-A' of the electronic device as shown in FIG. 1C, in accordance with an embodiment of the present disclosure.
Figure 1F:
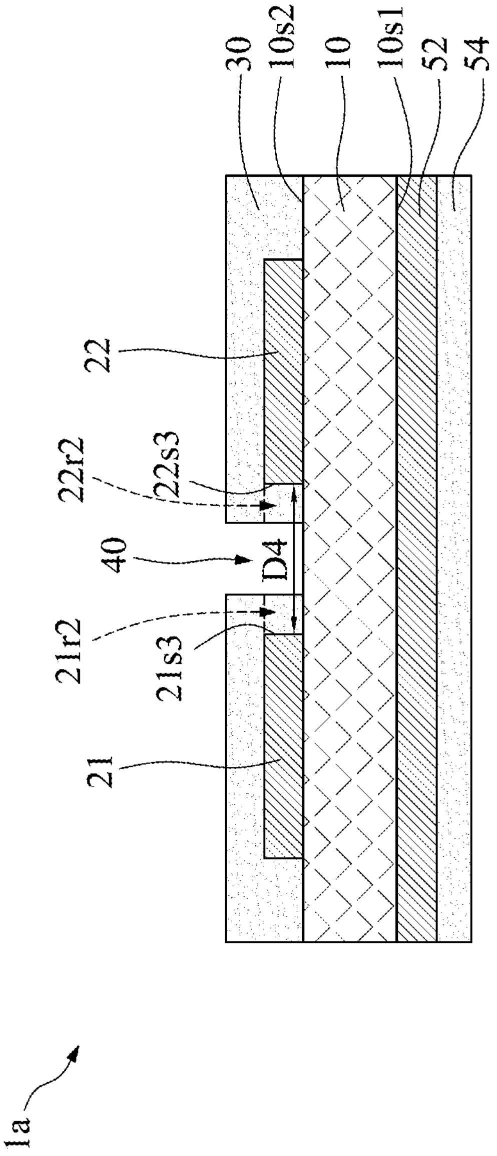
FIG. 1F is a cross-sectional view along line B-B' of the electronic device as shown in FIG. 1C, in accordance with an embodiment of the present disclosure.

FIG. 1A, FIG. 1B, FIG. 1C, FIG. 1D, FIG. 1E, and FIG. 1F illustrate an electronic device 1*a*, wherein FIG. 1A is a perspective view, FIG. 1B is an exploded view in which an insulation layer is detached for brevity, FIG. 1C and FIG. 1D are top views, the insulation layer as shown in FIG. 1C is omitted from FIG. 1D for brevity, FIG. 1E illustrates a cross-sectional view along line A-A' of the electronic device 1*a* as shown in FIG. 1C, and FIG. 1F illustrates a cross-sectional view along line B-B' of the electronic device 1*a* as shown in FIG. 1C.

As shown in FIG. 1A and FIG. 1B, the electronic device 1*a* may include a carrier 10, pads 21, 22, 23, and 24, an insulation layer 30, a conductive layer 52, and an insulation layer 54. The carrier 10, the insulation layer 30, the conductive layer 52, and the insulation layer 54 may collectively define a substrate 4. In some embodiments, the substrate 4 may define a trench 40 extending along the Y direction.

In some embodiments, the carrier 10 may include a core substrate. In some embodiments, the material of the carrier 10 may include prepreg (PP), ajinomoto build-up film (ABF), or other suitable materials. In some embodiments, a resin material used in the core substrate may be a fiber-reinforced resin so as to strengthen the core substrate, and the reinforcing fibers may be, without limitation to, glass fibers or Kevlar fibers (aramid fibers). The carrier 10 may have a surface 10*s*1 (or a lower surface or a bottom surface) and a surface 10*s*2 (or an upper surface or a top surface) opposite to the surface 10*s*1.

In some embodiments, each of the pads 21, 22, 23, and 24 (or terminals) may be disposed on or over the surface 10*s*2 of the carrier 10. Each of the pads 21 to 24 may include a conductive material(s), such as copper (Cu), aluminum (Al), tungsten (W), titanium (Ti), tantalum (Ta), or other applicable materials. In some embodiments, the pad 22 may be referred to as a first pad, the pad 24 may be referred to as a second pad (or a third pad), and the pad 21 may be referred to as a third pad (or a second pad).

Figure 4A:
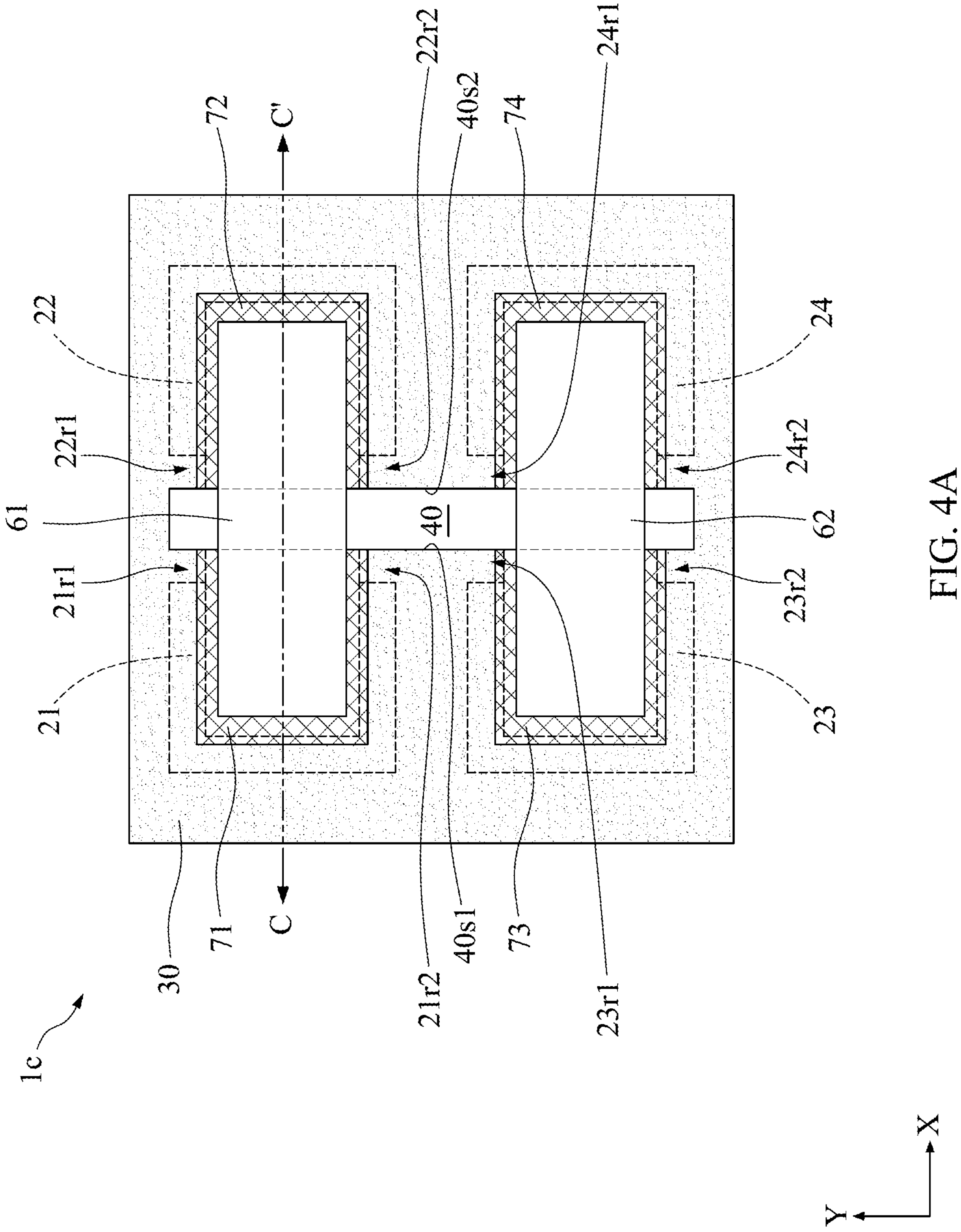
FIG. 4A is a top view of an electronic device, in accordance with an embodiment of the present disclosure.

Referring to FIG. 1C and FIG. 1D, the pads 21 and 22 may be arranged along the X direction. The pads 21 and 22 may be substantially aligned along the X direction. The pads 21 and 22 may be configured to serve as a pair of pads to be electrically connected to an electronic component 61 (FIG. 4A). The pads 23 and 24 may be arranged along the X direction. The pads 23 and 24 may be substantially aligned along the X direction. The pads 23 and 24 may be configured to serve as a pair of pads to be electrically connected to another electronic component 62 (FIG. 4A). The pads 21 and 23 may be arranged along the Y direction. The pads 21 and 23 may be substantially aligned along the Y direction. The pads 22 and 24 may be arranged along the Y direction. The pads 22 and 24 may be substantially aligned along the Y direction.

In some embodiments, the pad 21 may include or define an indentation 21*r*1 (or a barrier structure or a recessed portion) and an indentation 21*r*2, each of which is recessed from a surface 21*s*1 (or lateral surface or edge) of the pad 21. In some embodiments, each of the indentations 21*r*1 and 21*r*2 may be a notch with, for example, a square profile, a rectangular profile, or other suitable profiles, which is disposed at a corner of the pad 21. In some embodiments, each of the indentations 21*r*1 and 21*r*2 may abut or be adjacent to the trench 40. In some embodiments, the indentation 21*r*1 may be substantially aligned with the indentation 21*r*2 along the Y direction. In some embodiments, the pad 21 may have surfaces (or lateral surfaces or sidewalls) 21*s*1, 21*s*2, 21*s*3, and 21*s*4. The surface 21*s*1 may extend along the Y direction. The surface 21*s*2 may extend along the X direction and extend between the surfaces 21*s*1 and 21*s*3. The surface 21*s*3 may extend along the Y direction and extend between the surfaces 21*s*2 and 21*s*4. The surface 21*s*4 may extend along the X direction. In some embodiments, the surface 21*s*1 may be substantially parallel to the surface 21*s*3. In some embodiments, the surface 21*s*1 may be substantially orthogonal to the surface 21*s*2. In some embodiments, the surface 21*s*2 may be substantially parallel to the surface 21*s*4. In some embodiments, the surface 21*s*3 may be substantially orthogonal to the surface 21*s*4. In some embodiments, the surfaces 21*s*2 and 21*s*3 may collectively define the indentation 21*r*2. Similarly, the indentation 21*r*1 may be defined by a lateral surface extending along the X direction and a lateral surface extending along the Y direction. The indentation 21*r*2 may be defined by two edges (e.g., surfaces 21*s*2 and 21*s*3) which abut.

In some embodiments, the pad 22 may include or define an indentation 22*r*1 and an indentation 22*r*2, each of which is recessed from a surface 22*s*1 (or lateral surface) of the pad 22. In some embodiments, each of the indentations 22*r*1 and 22*r*2 may be a notch with, for example, a square profile, a rectangular profile, or other suitable profiles, which is disposed at a corner of the pad 22. In some embodiments, each of the indentations 22*r*1 and 22*r*2 may abut or be adjacent to the trench 40. In some embodiments, the indentation 22*r*1 may be substantially aligned with the indentation 22*r*2 along the Y direction. The indentation 22*r*1 may face the indentation 21*r*1. The indentation 22*r*1 may be substantially aligned with the indentation 21*r*1 along the X direction. The indentation 22*r*1 may be laterally aligned with the indentation 21*r*1. The indentation 22*r*2 may face the indentation 21*r*2. The indentation 22*r*2 may be aligned with the indentation 21*r*2 along the X direction. The indentation 22*r*2 may be laterally aligned with the indentation 21*r*2 along the X direction. In some embodiments, the pad 22 may have surfaces 22*s*1, 22*s*2, 22*s*3, and 22*s*4 (or lateral surfaces or sidewalls). The surface 22*s*1 may extend along the Y direction. The surface 22*s*2 may extend along the X direction and extend between the surfaces 22*s*1 and 22*s*3. The surface 22*s*3 may extend along the Y direction and extend between the surfaces 22*s*2 and 22*s*4. The surface 22*s*4 may extend along the X direction. In some embodiments, the surface 22*s*1 may be substantially parallel to the surface 22*s*3. In some embodiments, the surface 22*s*1 may be substantially orthogonal to the surface 22*s*2. In some embodiments, the surface 22*s*2 may be substantially parallel to the surface 22*s*4. In some embodiments, the surface 22*s*3 may be substantially orthogonal to the surface 22*s*4. In some embodiments, the surfaces 22*s*2 and 22*s*3 may collectively define the indentation 22*r*2. Similarly, the indentation 22*r*1 may be defined by a lateral surface extending along the X direction and a lateral surface extending along the Y direction.

In some embodiments, the pad 23 may include or define an indentation 23*r*1 and an indentation 23*r*2, each of which is recessed from a surface 23*s*1 (or a lateral surface) of the pad 23. In some embodiments, each of the indentations 23*r*1 and 23*r*2 may be a notch with, for example, a square profile, a rectangular profile, or other suitable profiles, which is disposed at a corner of the pad 23. In some embodiments, each of the indentations 23*r*1 and 23*r*2 may abut or be adjacent to the trench 40. In some embodiments, the indentation 23*r*1 may be substantially aligned with the indentation 23*r*2 along the Y direction. The indentation 23*r*1 may face the indentation 21*r*2. The indentation 23*r*1 may be substantially aligned with the indentation 21*r*2 along the Y direction. In some embodiments, the pad 23 may have surfaces 23*s*1, 23*s*2, 23*s*3, and 23*s*4 (or lateral surfaces or sidewalls). The surface 23*s*1 may extend along the Y direction. The surface 23*s*2 may extend along the X direction and extend between the surfaces 23*s*1 and 23*s*3. The surface 23*s*3 may extend along the Y direction and extend between the surfaces 23*s*2 and 23*s*4. The surface 23*s*4 may extend along the X direction. In some embodiments, the surface 23*s*1 may be substantially parallel to the surface 23*s*3. In some embodiments, the surface 23*s*1 may be substantially orthogonal to the surface 23*s*2. In some embodiments, the surface 23*s*2 may be substantially parallel to the surface 23*s*4. In some embodiments, the surface 23*s*3 may be substantially orthogonal to the surface 23*s*4. In some embodiments, the surfaces 23*s*2 and 23*s*3 may collectively define the indentation 23*r*1. Similarly, the indentation 23*r*2 may be defined by a lateral surface extending along the X direction and a lateral surface extending along the Y direction.

In some embodiments, the pad 24 may include or define an indentation 24*r*1 and an indentation 24*r*2, each of which is recessed from a surface 24*s*1 (or a lateral surface) of the pad 24. In some embodiments, each of the indentations 24*r*1 and 24*r*2 may be a notch with, for example, a square profile, a rectangular profile, or other suitable profiles, which is disposed at a corner of the pad 24. In some embodiments, each of the indentations 24*r*1 and 24*r*2 may abut or be adjacent to the trench 40. In some embodiments, the indentation 24*r*1 may be substantially aligned with the indentation 24*r*2 along the Y direction. The indentation 24*r*1 may face the indentation 23*r*1. The indentation 24*r*1 may be substantially aligned with the indentation 23*r*1 along the X direction. The indentation 24*r*1 may be laterally aligned with the indentation 23*r*1. The indentation 24*r*2 may face the indentation 23*r*2. The indentation 24*r*2 may be aligned with the indentation 23*r*2 along the X direction. The indentation 24*r*2 may be laterally aligned with the indentation 23*r*2 along the X direction. The indentation 24*r*1 may face the indentation 22*r*2. The indentation 24*r*1 may be aligned with the indentation 22*r*2 along the Y direction. In some embodiments, the pad 24 may have surfaces 24*s*1, 24*s*2, 24*s*3, and 24*s*4 (or lateral surfaces or sidewalls). The surface 24*s*1 may extend along the Y direction. The surface 24*s*2 may extend along the X direction and extend between the surfaces 24*s*1 and 24*s*3. The surface 24*s*3 may extend along the Y direction and extend between the surfaces 24*s*2 and 24*s*4. The surface 24*s*4 may extend along the X direction. In some embodiments, the surface 24*s*1 may be substantially parallel to the surface 24*s*3. In some embodiments, the surface 24*s*1 may be substantially orthogonal to the surface 24*s*2. In some embodiments, the surface 24*s*2 may be substantially parallel to the surface 24*s*4. In some embodiments, the surface 24*s*3 may be substantially orthogonal to the surface 24*s*4. In some embodiments, the surfaces 24*s*2 and 24*s*3 may collectively define the indentation 24*r*1. Similarly, the indentation 24*r*2 may be defined by a lateral surface extending along the X direction and a lateral surface extending along the Y direction.

In some embodiments, the insulation layer 30 may be disposed on or over the surface 10*s*2 of the carrier 10. In some embodiments, the insulation layer 30 may be disposed on or over the pads 21, 22, 23, and 24. As shown in FIG. 1B, the insulation layer 30 may define an opening 30*t* exposing the carrier 10, the pads 21, 22, 23, and 24. The area of the pad 22 exposed by the opening 30*t* may be equal to or less than the surface area of the entire top surface of the pad 22.

As shown in FIG. 1C, the insulation layer 30 may cover a portion of the pad 21. The insulation layer 30 may partially cover the pad 21. The pad 21 may have a portion 21*a* exposed by the insulation layer 30 and a portion 21*b* covered by the insulation layer 30. In some embodiments, the insulation layer 30 may cover a portion of the pad 22. The insulation layer 30 may partially cover the pad 22. The pad 22 may have a portion 22*a* exposed by the insulation layer 30 and a portion 22*b* covered by the insulation layer 30. In some embodiments, the insulation layer 30 may cover a portion of the pad 23. The insulation layer 30 may partially cover the pad 23. The pad 23 may have a portion 23*a* exposed by the insulation layer 30 and a portion 23*b* covered by the insulation layer 30. In some embodiments, the insulation layer 30 may cover a portion of the pad 24. The insulation layer 30 may partially cover the pad 24. The pad 21 may have a portion 24*a* exposed by the insulation layer 30 and a portion 24*b* covered by the insulation layer 30. In some embodiments, the insulation layer 30 may be configured to determine a pattern of an electrical connector 71, 72, 73, and/or 74 (FIG. 4A) (e.g., a solder material). The portions 21*a*, 22*a*, 23*a*, and 24*a* may be configured to support electrical connectors. In some embodiments, the insulation layer 30 and the pads 21, 22, 23, and 24 may be configured to determine a pattern of the trench 40. In some embodiments, the insulation layer 30 may be free from vertically overlapping the trench 40. The insulation layer 30 may include a solder resist, which may include epoxy resin or other suitable materials.

The insulation layer 30 may have a surface 30*s*1 (or a lateral surface) and a surface 30*s*2 (or a lateral surface) facing the surface 30*s*1. The surface 30*s*1 may be exposed to the trench 40. The surface 30*s*2 may be exposed to the trench 40. In some embodiments, the surface 30*s*1 of the insulation layer 30 may be substantially aligned with the surface 21*s*1 of the pad 21. In some embodiments, the surface 30*s*2 of the insulation layer 30 may be substantially aligned with the surface 22*s*1 of the pad 22. In some embodiments, the surface 30*s*1 of the insulation layer 30 may be substantially aligned with the surface 23*s*1 of the pad 23. In some embodiments, the surface 30*s*2 of the insulation layer 30 may be substantially aligned with the surface 24*s*1 of the pad 24. In some embodiments, the insulation layer 30 may have rounding corners, which define the corners of the opening 30*t*, in a top view. In other embodiments, the insulation layer 30 may have substantially right-angle corners.

In some embodiments, the surface 21*s*1 of the pad 21 may be exposed by the insulation layer 30. The surface 21*s*2 of the pad 21 may be covered by the insulation layer 30. The surface 21*s*3 of the pad 21 may be covered by the insulation layer 30. The surface 21*s*4 of the pad 21 may be covered by the insulation layer 30. In some embodiments, the surface 22*s*1 of the pad 22 may be exposed by the insulation layer 30. The surface 22*s*2 of the pad 22 may be covered by the insulation layer 30. The surface 22*s*3 of the pad 22 may be covered by the insulation layer 30. The surface 22*s*4 of the pad 22 may be covered by the insulation layer 30. In some embodiments, the surface 23*s*1 of the pad 23 may be exposed by the insulation layer 30. The surface 23*s*2 of the pad 23 may be covered by the insulation layer 30. The surface 23*s*3 of the pad 23 may be covered by the insulation layer 30. The surface 23*s*4 of the pad 23 may be covered by the insulation layer 30. In some embodiments, the surface 24*s*1 of the pad 24 may be exposed by the insulation layer 30. The surface 24*s*2 of the pad 24 may be covered by the insulation layer 30. The surface 24*s*3 of the pad 24 may be covered by the insulation layer 30. The surface 24*s*4 of the pad 24 may be covered by the insulation layer 30.

The trench 40 may be defined over the carrier 10. The trench 40 may be defined by the insulation layer 30 and the pads 21, 22, 23, and 24. The insulation layer 30 may define an outline of the trench 40. In some embodiments, the trench 40 may be defined between the pads 21 and 22 and between the pads 23 and 24. In some embodiments, the trench 40 may extend along the Y direction. The trench 40 may have a side 40*s*1 and a side 40*s*2 opposite to the side 40*s*1. The pad 21 may be located at the side 40*s*1 of the trench 40. The pad 22 may be located at the side 40*s*2 of the trench 40. The pad 23 may be located at the side 40*s*1 of the trench 40. The pad 24 may be located at the side 40*s*2 of the trench 40. The pads 21 and 23 may be located at the same side (e.g., side 40*s*1) of the trench 40. The pads 22 and 24 may be located at the same side (e.g., side 40*s*2) of the trench 40.

The surface 22*s*2 of the pad 22 and the surface 24*s*2 of the pad 24 may define a gap G1 which has a distance D1 along the Y direction. The surface 22*s*4 of the pad 22 and the surface 24*s*4 of the pad 24 may define a gap G2 which has a distance D2 along the Y direction. The gap G1 may be closer to the trench 40 than the gap G2 is. In some embodiments, the distance D1 may be greater than the distance D2. The distance D1 may be closer to the trench 40 than the distance D2 is. The surface 21*s*1 of the pad 21 and the surface 22*s*1 of the pad 22 may define a gap G3 which has a distance D3 along the X direction. The surface 21*s*3 of the pad 21 and the surface 22*s*3 of the pad 22 may define a gap G4 which has a distance D4 along the X direction. The gap G4 may be closer to the trench 40 than the gap G3 is. In some embodiments, the distance D4 may be greater than the distance D3. In some embodiments, the pad 22 may have a width reducing from the pad 22 toward the trench 40 along the X direction. In some embodiments, the pad 24 may have a width reducing from the pad 24 toward the trench 40 along the X direction.

As shown in FIG. 1D, the pad 22 may include a portion 221 and a portion 222 exposed to the trench 40. The portion 222 may be disposed between the portion 221 and the trench 40. The portion 221 has a dimension W1 (e.g., length or width) along the Y direction greater than a dimension W2 (e.g., length or width) of the portion 222. The pad 24 may include a portion 241 and a portion 242 exposed to the trench 40. The portion 242 may be disposed between the portion 241 and the trench 40. The portion 241 may have a greater dimension (e.g., length or width) along the Y direction than that of the portion 242. The distance D1 may be defined by a distance between the portion 222 of the pad 22 and the portion 242 of the pad 24. The distance D2 may be defined by a distance between the portion 221 of the pad 22 and the portion 241 of the pad 24.

Referring back to FIG. 1A and FIG. 1B, the conductive layer 52 may be disposed on or under the surface 10*s*1 of the carrier 10. The conductive layer 52 may include a conductive pattern, which may be electrically connected to an external device (not shown). The conductive layer 52 may include a conductive material(s), such as copper (Cu), aluminum (Al), tungsten (W), titanium (Ti), tantalum (Ta), or other applicable materials.

The insulation layer 54 may be disposed under the conductive layer 52. In some embodiments, the insulation layer 54 may define openings (not shown) which exposes the conductive layer 52 to facilitate the electrical connection between the conductive layer 52 and an external device. The insulation layer 54 may include a solder resist, which may include epoxy resin or other suitable materials.

Referring to FIG. 1E, the trench 40 may extend between the pads 21 and 22. The upper surface (not denoted) of the insulation layer 30 may include a substantially flat surface over the carrier 10, the pad 21, and the pad 22. In some embodiments, the difference between the distance D1 and the distance D2 (FIG. 1C) may be greater than the thickness of the insulation layer 30 that is disposed on the pad 21 (or 22).

Referring to FIG. 1F, a portion of the insulation layer 30 may be disposed between the pad 21 and the trench 40. In some embodiments, a portion of the insulation layer 30 may be disposed between the pad 22 and the trench 40. In some embodiments, a portion of the insulation layer 30 may be disposed between the pads 21 and 22. In some embodiments, the indentation 21r2 of the pad 21 may be filled by the insulation layer 30. In some embodiments, the indentation 22r2 of the pad 22 may be filled by the insulation layer 30.

In a comparative scenario, if the pattern of an insulation layer is shifted, it can lead to the bridging of electrical connectors (such as solder materials) between different pads through the trench. This issue may arise when the distance between the pads is reduced or when there is an excessive amount of solder materials, resulting in the malfunctioning of the electronic device. In this embodiment, the pads 21 to 24 may have indentations (e.g., 21r1 to 24r2), which can increase the distance between them. For instance, the distance D1 between pads 22 and 24, which is adjacent to trench 40, can be enlarged. With this enlarged distance D1, even if the pattern of the insulation layer 30 is shifted, the bridging of electrical connectors can be prevented. As a result, the performance of the electronic device 1a can be improved.

Figure 2A:
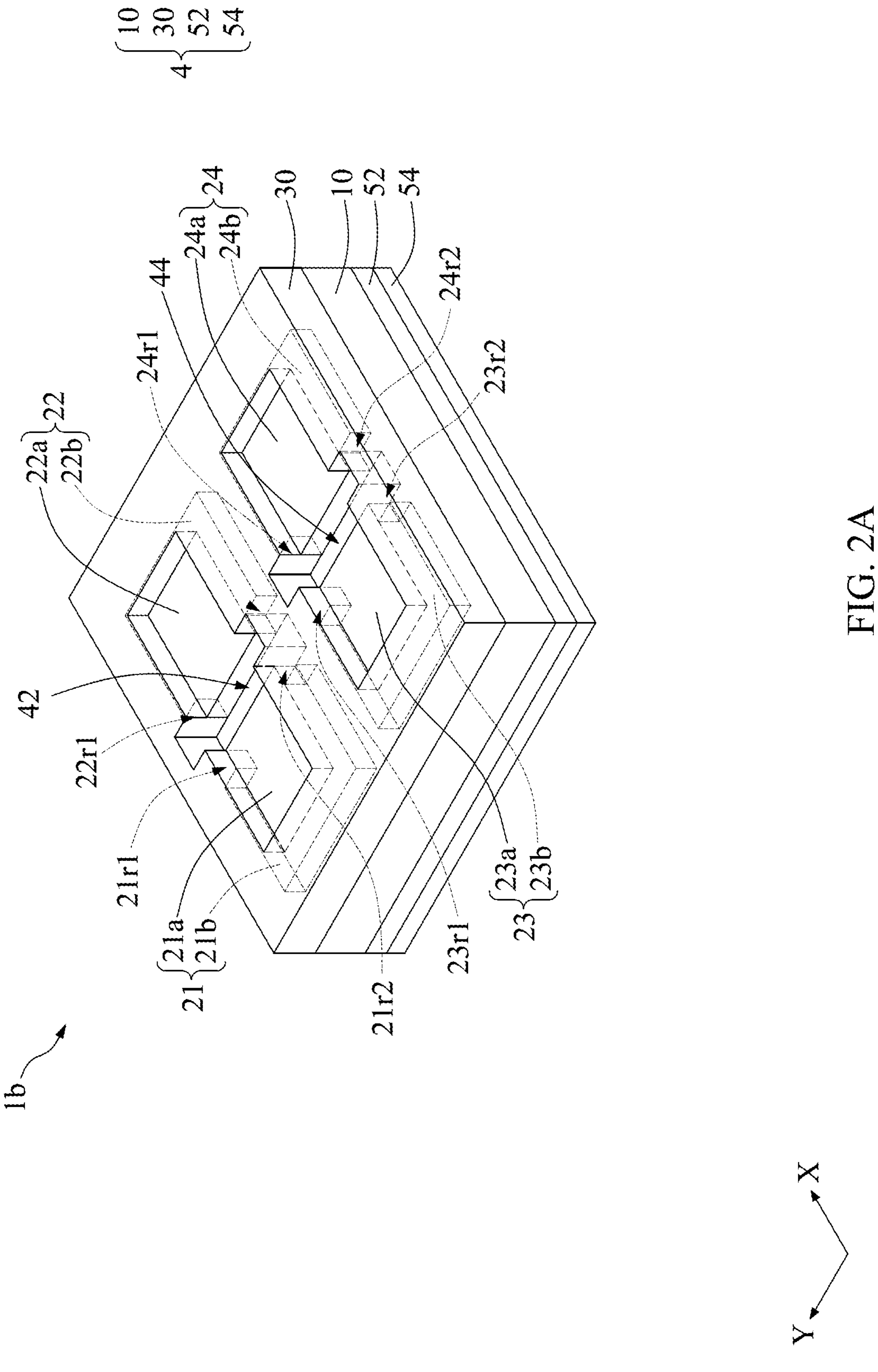
FIG. 2A is a perspective view of an electronic device, in accordance with an embodiment of the present disclosure.
Figure 2B:
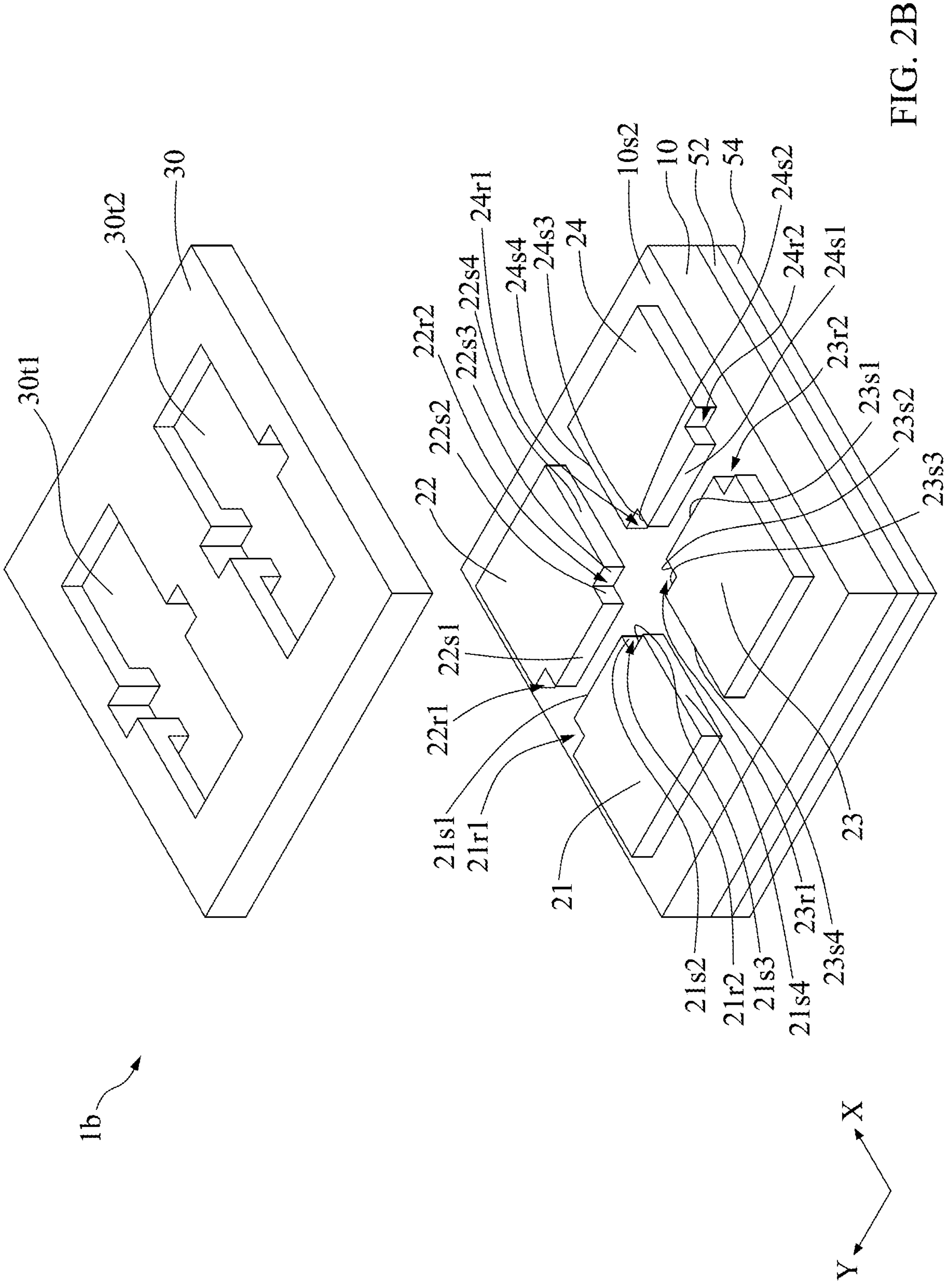
FIG. 2B is an exploded view of an electronic device as shown in FIG. 2A, in accordance with an embodiment of the present disclosure.
Figure 2C:
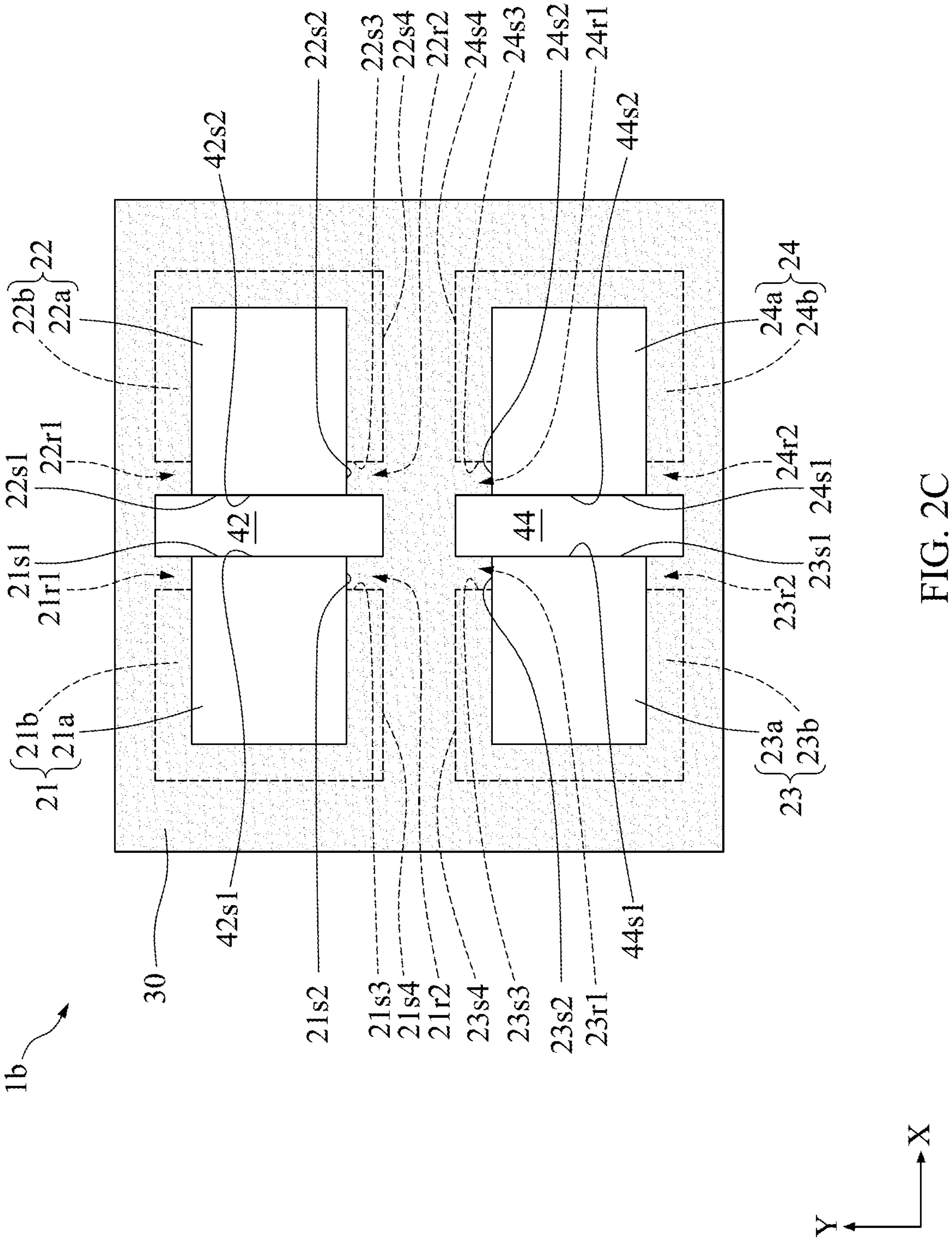
FIG. 2C is a top view of the electronic device as shown in FIG. 2A, in accordance with an embodiment of the present disclosure.

FIG. 2A, FIG. 2B, and FIG. 2C illustrate an electronic device 1b, wherein FIG. 2A is a perspective view, FIG. 2B is an exploded view in which an insulation layer is detached for brevity, and FIG. 2C is a top view. The electronic device 1b is similar to the electronic device 1a, and the differences therebetween are described below.

In some embodiments, the electronic device 1b may include a trench 42 and a trench 44 spaced apart from the trench 42. The trench 42 may be spaced apart from the trench 44 by the insulation layer 30. In some embodiments, the trench 42 may be defined between the pads 21 and 22 and extend along the Y direction. In some embodiments, the trench 44 may be defined between the pads 23 and 24 and extend along the Y direction. In some embodiments, the trench 42 may be aligned with the trench 44 along the Y direction.

As shown in FIG. 2B, the insulation layer 30 may define an opening 30t1 exposing the carrier 10, the pad 21, and the pad 22. The insulation layer 30 may define an opening 30t2 exposing the carrier 10, the pad 23, and the pad 24.

As shown in FIG. 2C, the trench 42 may have a side 42s1 and a side 42s2. The pad 21 may be located at the side 42s1 of the trench 42. The pad 22 may be located at the side 42s2 of the trench 42. The trench 44 may have a side 44s1 and a side 44s2. The pad 23 may be located at the side 44s1 of the trench 44. The pad 24 may be located at the side 44s2 of the trench 44.

FIG. 3A is a top view of a pad (e.g., the pad 24), in accordance with an embodiment of the present disclosure. In some embodiments, the indentation 24r1 may have a rectangle profile or a square profile. The surface 24s2 may be substantially orthogonal to the surface 24s3. In some embodiments, the length of the surface 24s2 may be substantially equal to the length of the surface 24s3. In some embodiments, the length of the surface 24s2 may be different from the length of the surface 24s3.

FIG. 3B is a top view of a pad (e.g., the pad 24), in accordance with an embodiment of the present disclosure. In some embodiments, the indentation 24r1 may be defined by the surface 24s2 and a surface 24s5. The surface 24s5 may extend between the surfaces 24s2 and 24s4. In some embodiments, the surface 24s5 may include a curved surface which is convex toward the surface 24s1.

FIG. 3C is a top view of a pad (e.g., the pad 24), in accordance with an embodiment of the present disclosure. In some embodiments, the indentation 24r1 may be defined by a surface 24s6. In some embodiments, the surface 24s6 may extend between the surfaces 24s1 and 24s4. In some embodiments, the surface 24s6 may include a convex surface.

FIG. 3D is a top view of a pad (e.g., the pad 24), in accordance with an embodiment of the present disclosure. In some embodiments, the indentation 24r1 may be defined by a surface 24s7. In some embodiments, the surface 24s7 may extend between the surfaces 24s1 and 24s4. In some embodiments, the surface 24s7 may include a concaved surface.

FIG. 3E is a top view of a pad (e.g., the pad 24), in accordance with an embodiment of the present disclosure. In some embodiments, the indentation 24r1 may be defined by a surface 24s8. In some embodiments, the surface 24s8 may extend between the surfaces 24s1 and 24s4. In some embodiments, the surface 24s8 may be slanted with respect to the surface 24s1. In some embodiments, the surface 24s8 may be slanted with respect to the surface 24s4.

FIG. 3F is a top view of a pad (e.g., the pad 24), in accordance with an embodiment of the present disclosure. In some embodiments, the indentations 24r1 and 24r2 may have different profiles. In some embodiments, the length T1 of the indentation 24r1 may be different from the length T2 of the indentation 24r2 along the Y direction. In some embodiments, the indentations 24r1 and 24r2 are unsymmetrical with respect to a central axis C, which passes through the geometry center, of the pad 24 along the X direction.

Each of the pad 21, 22, and 23 may have the profile as shown in FIG. 3A to FIG. 3F.

FIG. 4A is a top view of an electronic device 1c, in accordance with an embodiment of the present disclosure. The electronic device 1c is similar to the electronic device 1a as shown in FIG. 1C, and the differences therebetween are described below.

In some embodiments, the electronic device 1c may include electronic components 61 and 62 as well as electrical connectors 71, 72, 73, and 74. The electronic component 61 may be disposed on or over the pads 21 and 22. The electronic component 61 may be connected to the pad 21 by the electrical connector 71. The electronic component 61 may be connected to the pad 22 by the electrical connector 72. The electronic component 61 may be disposed over the trench 40. The electronic component 62 may be disposed on or over the pads 23 and 24. The electronic component 62 may be connected to the pad 23 by the electrical connector 73. The electronic component 62 may be connected to the pad 24 by the electrical connector 74. The electronic component 62 may be disposed over the trench 40. Each of the electronic component 61 and 62 may include an active component and/or a passive component. The active component may include a semiconductor die or a chip, such as a logic die (e.g., application processor (AP), system-on-a-chip (SoC), central processing unit (CPU), graphics processing unit (GPU), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies) or other active components. The passive component may include a resistor, a capacitor, an inductor, or a combination thereof. In some embodiments, the electronic component 61 may be free from vertically overlapping at least a portion the indentation 22*r*1 (or 22*r*2) of the pad 22.

The electrical connector 71 may be disposed on or over the pad 21. The electrical connector 72 may be disposed on or over the pad 22. The electrical connectors 71 and 72 may be disposed on opposite two sides (e.g., the side 40*s*1 and side 40*s*2) of the trench 40. The electrical connector 73 may be disposed on or over the pad 23. The electrical connector 74 may be disposed on or over the pad 24. The electrical connectors 73 and 74 may be disposed on opposite two sides (e.g., the side 40*s*1 and side 40*s*2) of the trench 40. Each of the electrical connectors 71, 72, 73, and 74 may include a solder material(s), which may include alloys of gold and tin solder or alloys of silver and tin solder, or other suitable materials.

Figure 4B:
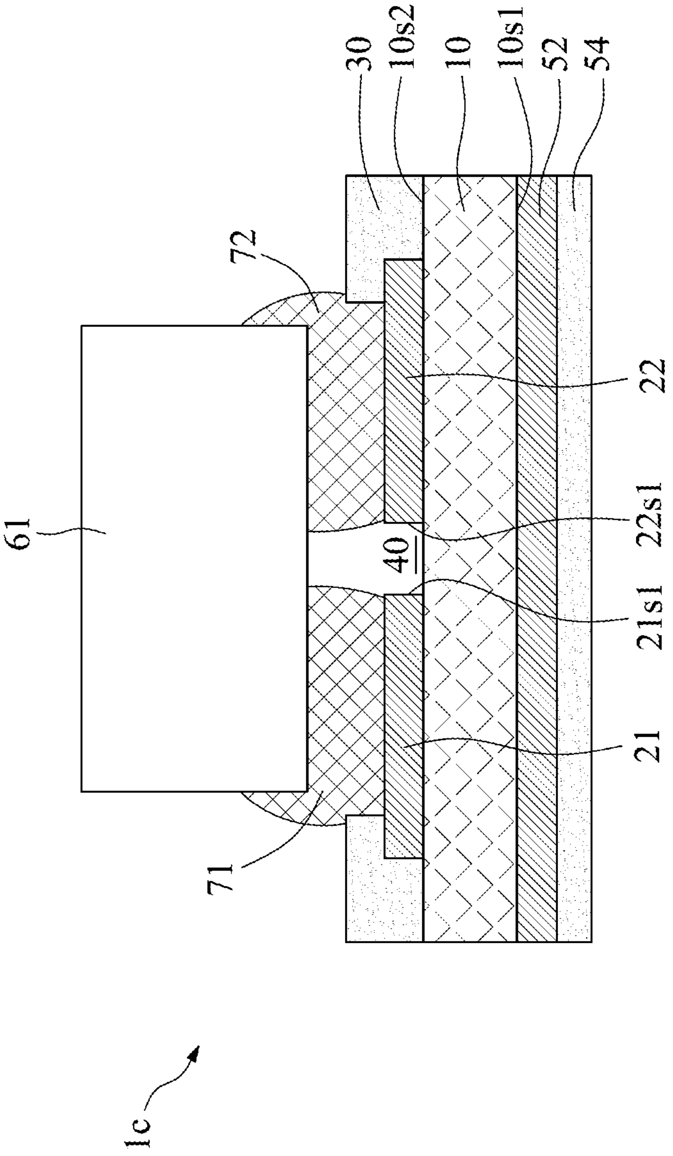
FIG. 4B is a cross-sectional view along line C-C' of the electronic device as shown in FIG. 4A, in accordance with an embodiment of the present disclosure.

FIG. 4B is a cross-sectional view along line C-C' of the electronic device 1*c* as shown in FIG. 4A, in accordance with an embodiment of the present disclosure. The electrical connector 71 may cover a portion of the upper surface of the insulation layer 30. A portion of the insulation layer 30 may be disposed between the electrical connector 71 and the pad 21. A portion of the insulation layer 30 may be disposed between the electrical connector 72 and the pad 22. In some embodiments, the surface 21*s*1 of the pad 21 may be free from being covered by the electrical connector 71. The electrical connector 72 may cover a portion of the upper surface of the insulation layer 30. In some embodiments, the surface 22*s*1 of the pad 22 may be free from being covered by the electrical connector 72. In some embodiments, the electrical connectors 71 and 72 may cover a portion of the lateral surface of the electronic component 61. However, the present disclosure is not intended to be limiting.

Figure 5A:
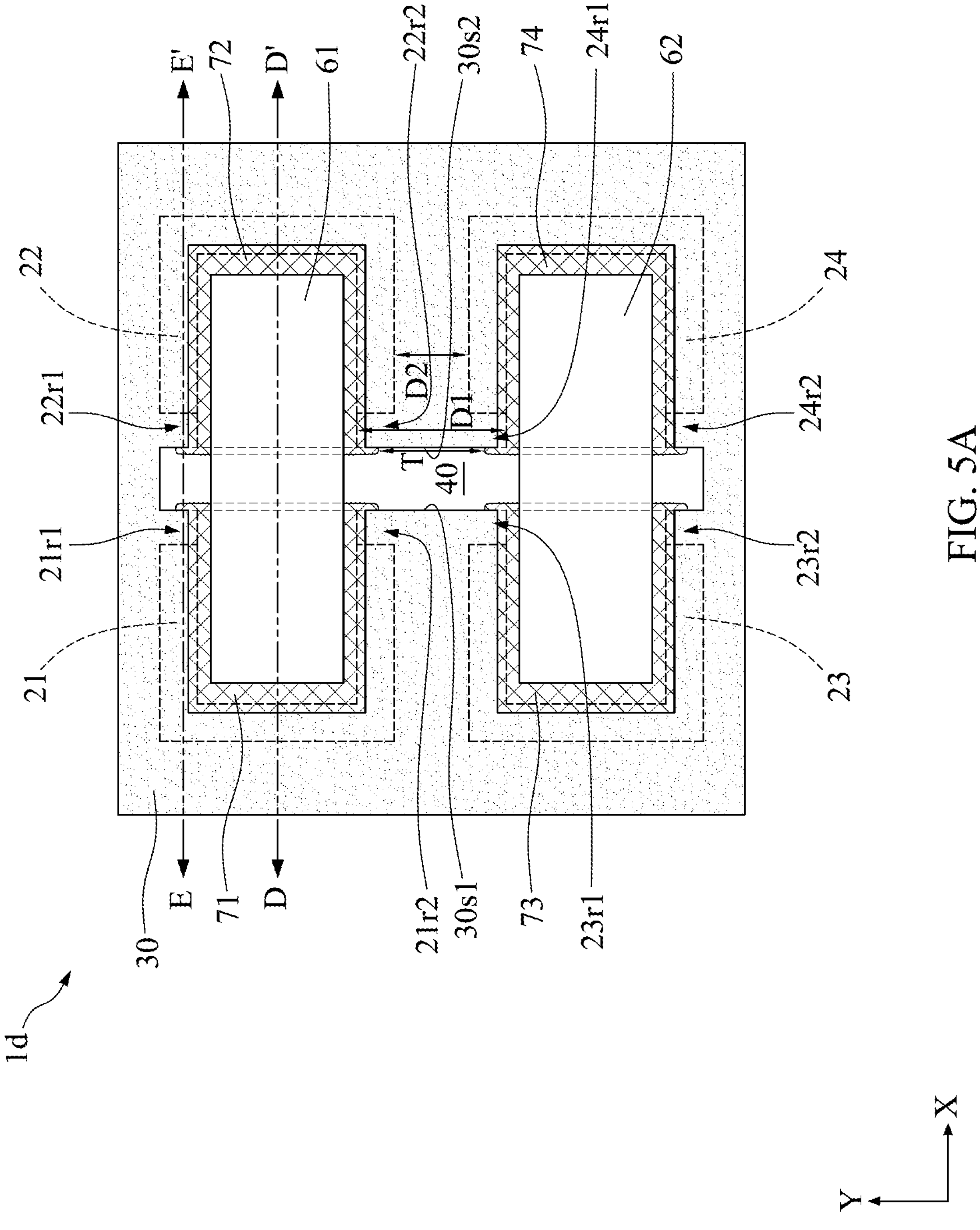
FIG. 5A is a top view of an electronic device, in accordance with an embodiment of the present disclosure.

FIG. 5A is a top view of an electronic device 1*d*, in accordance with an embodiment of the present disclosure. The electronic device 1*d* is similar to the electronic device 1*c* as shown in FIG. 4A, and the differences therebetween are described below.

In some embodiments, a portion of the electrical connector 71 may be disposed within the trench 40. In some embodiments, the electrical connector 71 may be disposed on or contact the surface 30*s*1 of the insulation layer 30. In some embodiments, a portion of the electrical connector 72 may be disposed within the trench 40. In some embodiments, the electrical connector 72 may be disposed on or contact the surface 30*s*2 of the insulation layer 30. In some embodiments, a portion of the electrical connector 73 may be disposed within the trench 40. In some embodiments, the electrical connector 73 may be disposed on or contact the surface 30*s*1 of the insulation layer 30. In some embodiments, a portion of the electrical connector 74 may be disposed within the trench 40. In some embodiments, the electrical connector 74 may be disposed on or contact the surface 30*s*2 of the insulation layer 30. In some embodiments, the portion, within the trench 40, of the electrical connector 71 may have a dimension (e.g., length or width) greater than a dimension (e.g., length or width) of the portion, over the pad 21, of the electrical connector 71 along the Y direction. In some embodiments, the portion, within the trench 40, of the electrical connector 72 may have a dimension (e.g., length or width) greater than a dimension (e.g., length or width) of the portion, over the pad 22, of the electrical connector 72 along the Y direction. In some embodiments, the portion, within the trench 40, of the electrical connector 73 may have a dimension (e.g., length or width) greater than a dimension (e.g., length or width) of the portion, over the pad 23, of the electrical connector 73 along the Y direction. In some embodiments, the portion, within the trench 40, of the electrical connector 74 may have a dimension (e.g., length or width) greater than a dimension (e.g., length or width) of the portion, over the pad 24, of the electrical connector 74 along the Y direction. In some embodiments, a lateral surface, exposed to the trench 40, of the electrical connector 72 may have a length greater than the lateral surface (e.g., the surface 22*s*1) of the pad 22 along the Y direction. In some embodiments, the distance T between the electrical connectors 72 and 74 may range between the distance between the distance D1 and the distance D2 as shown in FIG. 1D.

Figure 5B:
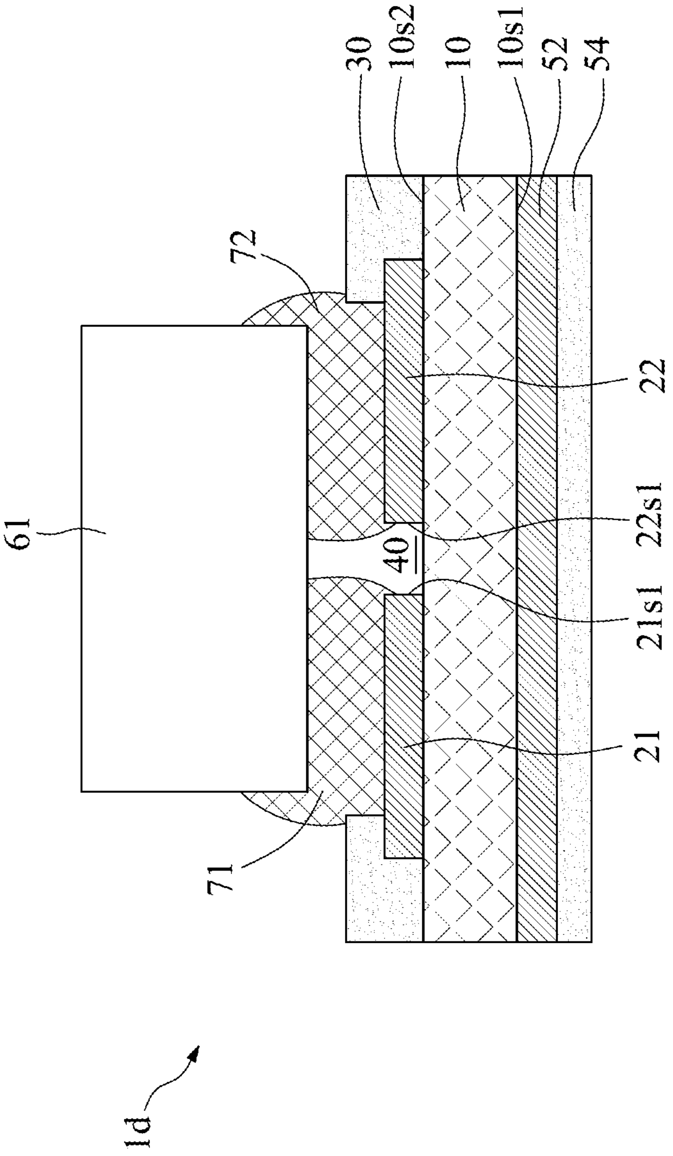
FIG. 5B is a cross-sectional view along line D-D' of the electronic device as shown in FIG. 5A, in accordance with an embodiment of the present disclosure.

FIG. 5B is a cross-sectional view along line D-D' of the electronic device 1*d* as shown in FIG. 5A, in accordance with an embodiment of the present disclosure. In some embodiments, the electrical connector 71 may cover a portion of the surface 21*s*1 of the pad 21. In some embodiments, the electrical connector 71 may extend to the surface 21*s*1 of the pad 21 adjacent to the trench 40. In some embodiments, the electrical connector 71 may contact a portion of the surface 21*s*1 of the pad 21. In some embodiments, the electrical connector 72 may cover a portion of the surface 22*s*1 of the pad 22. In some embodiments, the electrical connector 72 may contact a portion of the surface 22*s*1 of the pad 22.

Figure 5C:
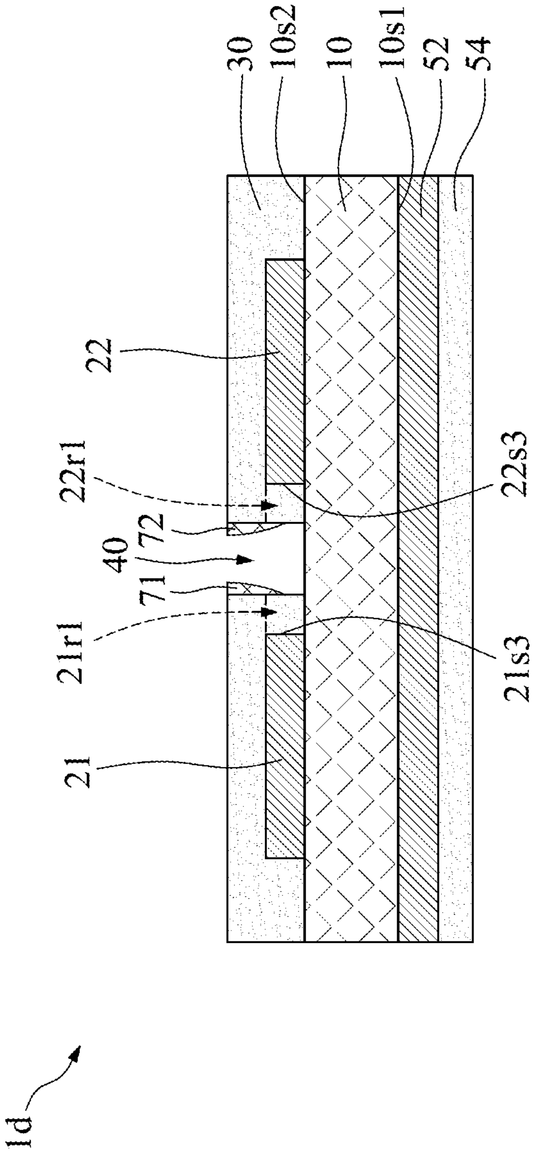
FIG. 5C is a cross-sectional view along line E-E' of the electronic device as shown in FIG. 5A, in accordance with an embodiment of the present disclosure.

FIG. 5C is a cross-sectional view along line E-E' of the electronic device 1*d* as shown in FIG. 5A, in accordance with an embodiment of the present disclosure. In some embodiments, a portion of the electrical connector 71 (or 72) may be disposed within or extend into the trench 40. In some embodiments, a portion of the electrical connector 71 (or 72) may be disposed on the lateral surface (or sidewall) of the insulation layer 30.

Figure 5D:
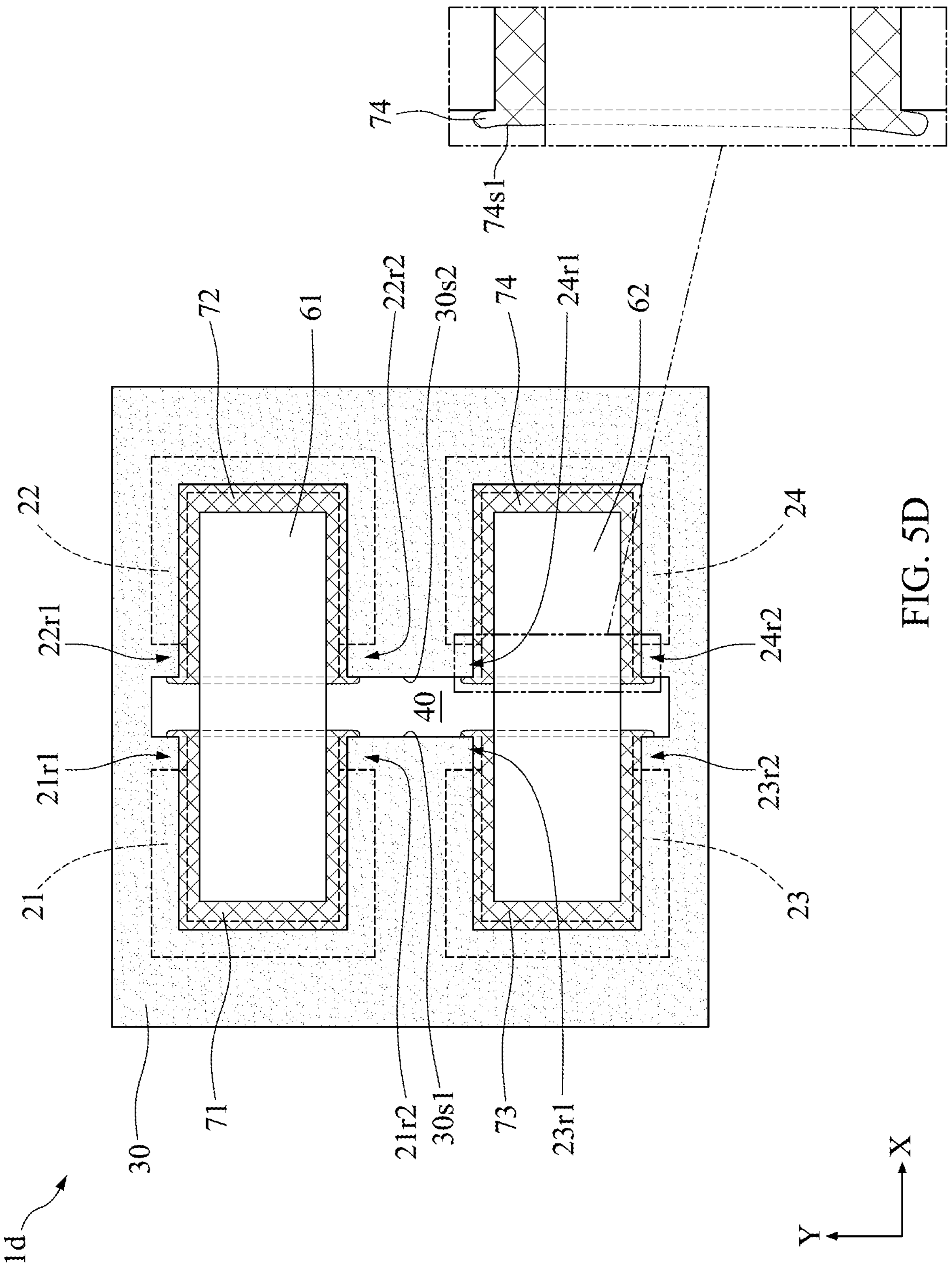
FIG. 5D is a partial enlarged view of the electronic device as shown in FIG. 5A, in accordance with an embodiment of the present disclosure.

FIG. 5D is a partial enlarged view of the electronic device as shown in FIG. 5A, in accordance with an embodiment of the present disclosure. The electrical connector 74 (or 71 to 73) may have a rough lateral surface in a top view. For example, a surface 74*s*1 (or lateral surface or sidewall) of the electrical connector 74 is disposed within the trench 40, and the surface 74*s*1 may be roughness. The electrical connector 74 includes two opposite end portions along the first direction. At least one of the two opposite end portions has a convex surface from a top view.

In this embodiment, even if the electrical connectors 72, 74 flow into the trench 40, the bridging of electrical connectors (e.g., the bridging between the electrical connectors 72 and 74) can be prevented. As a result, the performance of the electronic device 1*a* can be enhanced.

Figure 6:
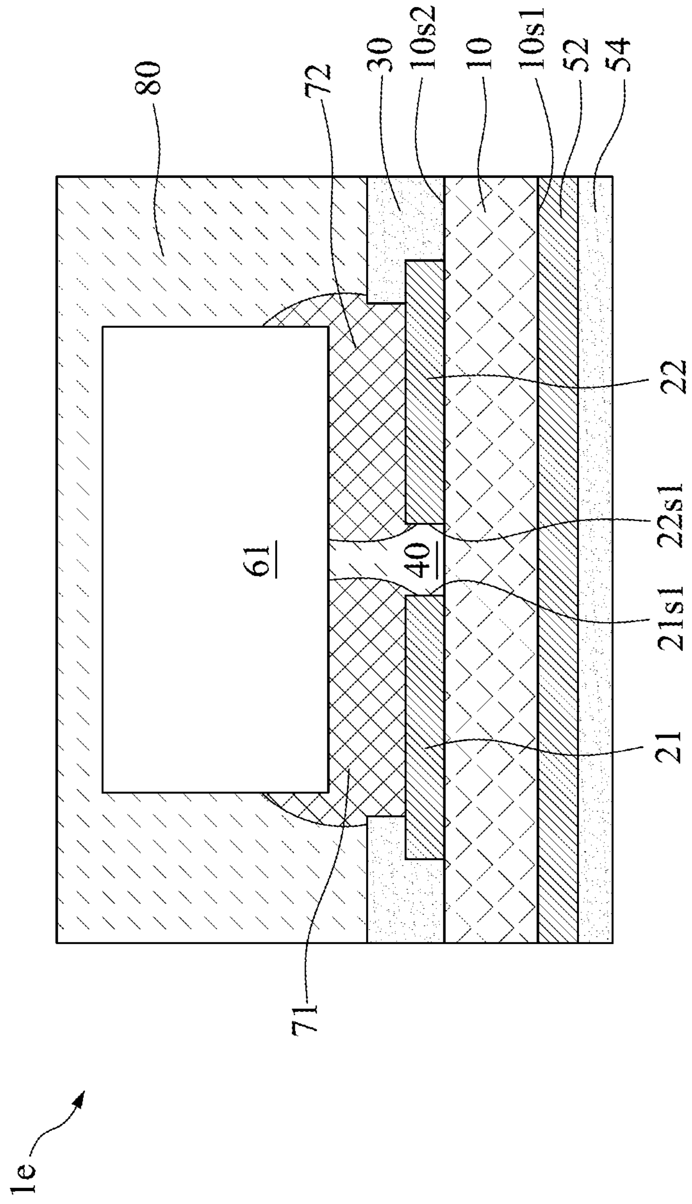
FIG. 6 is a cross-sectional view pf an electronic device, in accordance with an embodiment of the present disclosure.

FIG. 6 is a top view of an electronic device 1*e*, in accordance with an embodiment of the present disclosure. The electronic device 1*e* is similar to the electronic device 1*b* as shown in FIG. 4B, and the differences therebetween are described below.

In some embodiments, the electronic device 1*e* may include an encapsulant 80. In some embodiments, the encapsulant 80 may be disposed on or over the surface 10*s*2 of the carrier 10. The encapsulant 80 may cover the insulation layer 30. The encapsulant 80 may encapsulate the electronic component 61. The encapsulant 80 may encapsulate the electrical connector 71. The encapsulant 80 may encapsulate the electrical connector 72. In some embodiments, the encapsulant 80 may fill the trench 40. In some embodiments, the encapsulant 80 fill the gap between the electrical connectors 71 and 72. In some embodiments, the encapsulant 80 may be in contact with the surface 21*s*1 of the pad 21. In some embodiments, the encapsulant 80 may be in contact with the surface 22*s*1 of the pad 22. The encapsulant 80 may include a novolac-based resin, an epoxy-based resin, a silicone-based resin, or another suitable material. Suitable fillers may also be included, such as powdered $SiO_2$. The encapsulant 80 may be a molding compound with or without fillers.

Figure 7:
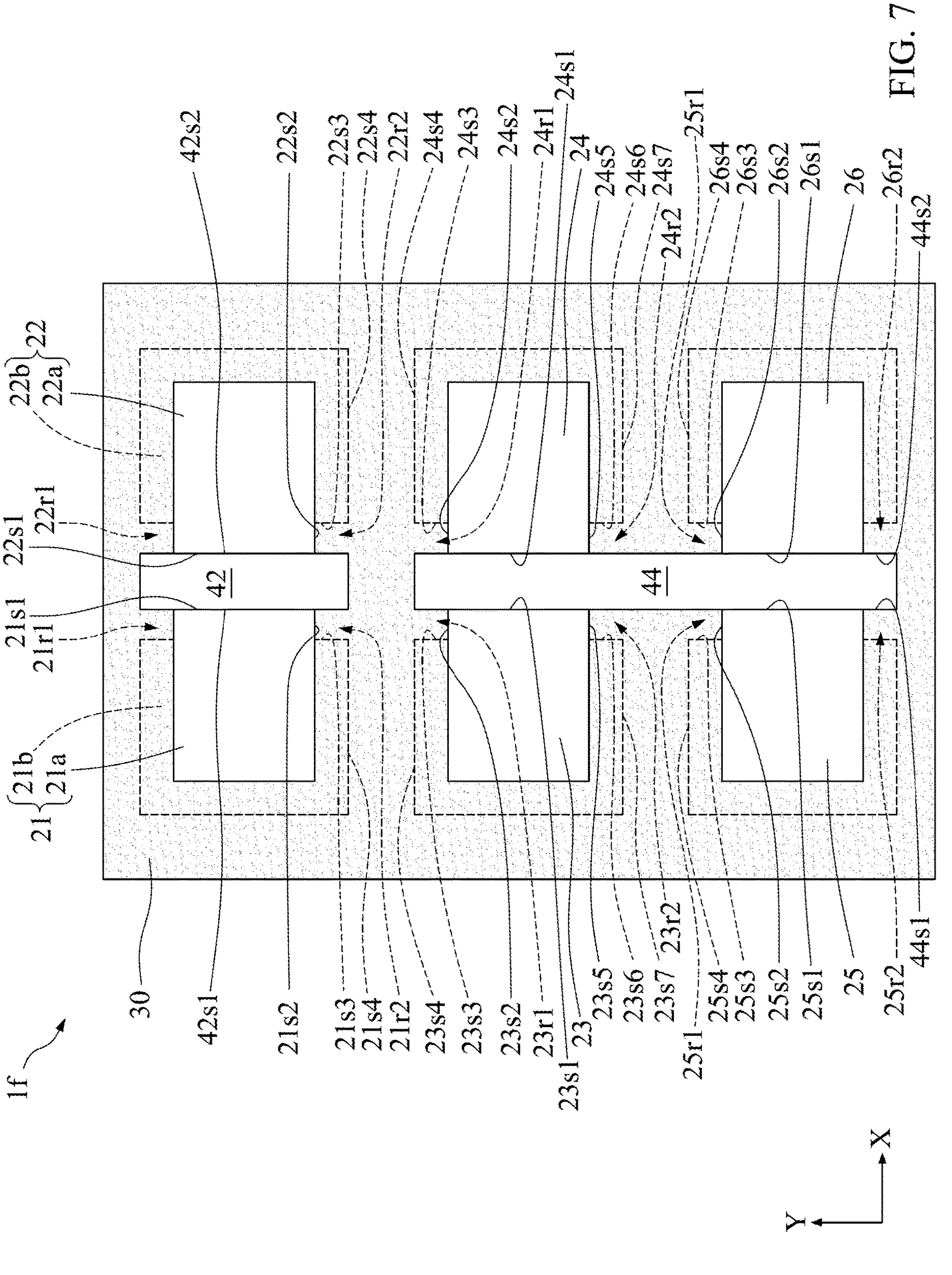
FIG. 7 is a top view of an electronic device, in accordance with an embodiment of the present disclosure.

FIG. 7 illustrates a top view of an electronic device 1*f*, in accordance with an embodiment of the present disclosure. The electronic device 1*f* is similar to the electronic device 1*a* as shown in FIG. 1C and the electronic device 1*b* as shown in FIG. 2C, and the differences therebetween are described below.

The pad 23 may include surfaces 23*s*5, 23*s*6, and 23*s*7. The surface 23*s*5 may extend along the X direction and extend between the surfaces 23*s*1 and 23*s*6. The surface 23*s*6 may extend along the Y direction and extend between the surfaces 23*s*5 and 23*s*7. The surface 23*s*7 may extend along the X direction. In some embodiments, the surface 23*s*5 may be substantially parallel to the surface 23*s*7. In some embodiments, the surface 23*s*5 may be substantially orthogonal to the surface 23*s*6. In some embodiments, the surface 23*s*1 may be substantially parallel to the surface 23*s*6. In some embodiments, the surfaces 23*s*5 and 23*s*6 may collectively define the indentation 23*r*2. The pad 24 may include surfaces 24*s*5, 24*s*6, and 24*s*7. The surface 24*s*5 may extend along the X direction and extend between the surfaces 24*s*1 and 24*s*6. The surface 24*s*6 may extend along the Y direction and extend between the surfaces 24*s*5 and 24*s*7. The surface 24*s*7 may extend along the X direction. In some embodiments, the surface 24*s*5 may be substantially parallel to the surface 24*s*7. In some embodiments, the surface 24*s*5 may be substantially orthogonal to the surface 24*s*6. In some embodiments, the surface 24*s*1 may be substantially parallel to the surface 24*s*6. In some embodiments, the surfaces 24*s*5 and 24*s*6 may collectively define the indentation 24*r*2.

In some embodiments, the electronic device 1*f* may include pads 25 and 26. Each of the pads 25 and 26 may include a conductive material(s), such as copper (Cu), aluminum (Al), tungsten (W), titanium (Ti), tantalum (Ta), or other applicable materials.

The pads 25 and 26 may be arranged along the X direction. The pads 25 and 26 may be substantially aligned along the X direction. The pads 25 and 26 may be configured to serve as a pair of pads to be electrically connected to an electronic component (not shown). The pads 23 and 25 may be arranged along the Y direction. The pads 24 and 26 may be substantially aligned along the Y direction.

In some embodiments, the pad 25 may include an indentation 25*r*1 and an indentation 25*r*2, each of which is recessed from a lateral surface of the pad 25. In some embodiments, each of the indentations 25*r*1 and 25*r*2 may be a notch with, for example, a square profile, a rectangular profile, or other suitable profiles, which is disposed at a corner of the pad 25. In some embodiments, each of the indentations 25*r*1 and 25*r*2 may abut or be adjacent to the trench 44. In some embodiments, the indentation 25*r*1 may be substantially aligned with the indentation 25*r*2 along the Y direction. The indentation 25*r*1 may face the indentation 23*r*2. The indentation 25*r*1 may be substantially aligned with the indentation 23*r*2 along the Y direction. In some embodiments, the pad 25 may have surfaces 25*s*1, 25*s*2, 25*s*3, and 25*s*4 (or lateral surfaces or sidewalls). The surface 25*s*1 may extend along the Y direction. The surface 25*s*2 may extend along the X direction and extend between the surfaces 25*s*1 and 25*s*3. The surface 25*s*3 may extend along the Y direction and extend between the surfaces 25*s*2 and 25*s*4. The surface 25*s*4 may extend along the X direction. In some embodiments, the surface 25*s*1 may be substantially parallel to the surface 25*s*3. In some embodiments, the surface 25*s*1 may be substantially orthogonal to the surface 25*s*2. In some embodiments, the surface 25*s*2 may be substantially parallel to the surface 25*s*4. In some embodiments, the surface 25*s*3 may be substantially orthogonal to the surface 25*s*4. In some embodiments, the surfaces 25*s*2 and 25*s*3 may collectively define the indentation 25*r*1. Similarly, the indentation 25*r*2 may be defined by a lateral surface extending along the X direction and a lateral surface extending along the Y direction.

In some embodiments, the pad 26 may include an indentation 26*r*1 and an indentation 26*r*2, each of which is recessed from a lateral surface of the pad 26. In some embodiments, each of the indentations 26*r*1 and 26*r*2 may be a notch with, for example, a square profile, a rectangular profile, or other suitable profiles, which is disposed at a corner of the pad 26. In some embodiments, each of the indentations 26*r*1 and 26*r*2 may abut or be adjacent to the trench 44. In some embodiments, the indentation 26*r*1 may be substantially aligned with the indentation 26*r*2 along the Y direction. The indentation 26*r*1 may face the indentation 24*r*2. The indentation 26*r*1 may be substantially aligned with the indentation 24*r*2 along the Y direction. In some embodiments, the pad 26 may have surfaces 26*s*1, 26*s*2, 26*s*3, and 26*s*4 (or lateral surfaces or sidewalls). The surface 26*s*1 may extend along the Y direction. The surface 26*s*2 may extend along the X direction and extend between the surfaces 26*s*1 and 26*s*3. The surface 26*s*3 may extend along the Y direction and extend between the surfaces 26*s*2 and 26*s*4. The surface 26*s*4 may extend along the X direction. In some embodiments, the surface 26*s*1 may be substantially parallel to the surface 26*s*3. In some embodiments, the surface 26*s*1 may be substantially orthogonal to the surface 26*s*2. In some embodiments, the surface 26*s*2 may be substantially parallel to the surface 26*s*4. In some embodiments, the surface 26*s*3 may be substantially orthogonal to the surface 26*s*4. In some embodiments, the surfaces 26*s*2 and 26*s*3 may collectively define the indentation 26*r*1. Similarly, the indentation 26*r*2 may be defined by a lateral surface extending along the X direction and a lateral surface extending along the Y direction.

In some embodiments, the pads 23, 24, 25, and 26 may share the trench 44. In some embodiments, the trench 44 may extend from the pad 23 to the pad 25.

In some cases, the amount of solder materials coated on pads may be relatively great, which causes the solder materials flowing into the shared trench. In this condition, the solder materials over different pads may be bridged within the shared trench, which causes the short between electronic components. In this embodiment, the pads 23, 24, 25, and 26 include indentations, which enlarges the distance between abutting pads (e.g., the pads 24 and 26) adjacent to the trench 44. In this condition, even if the electrical connectors (e.g., solder material) is filled into the trench 44, the short between the electrical connectors may be prevented.

Figure 8:
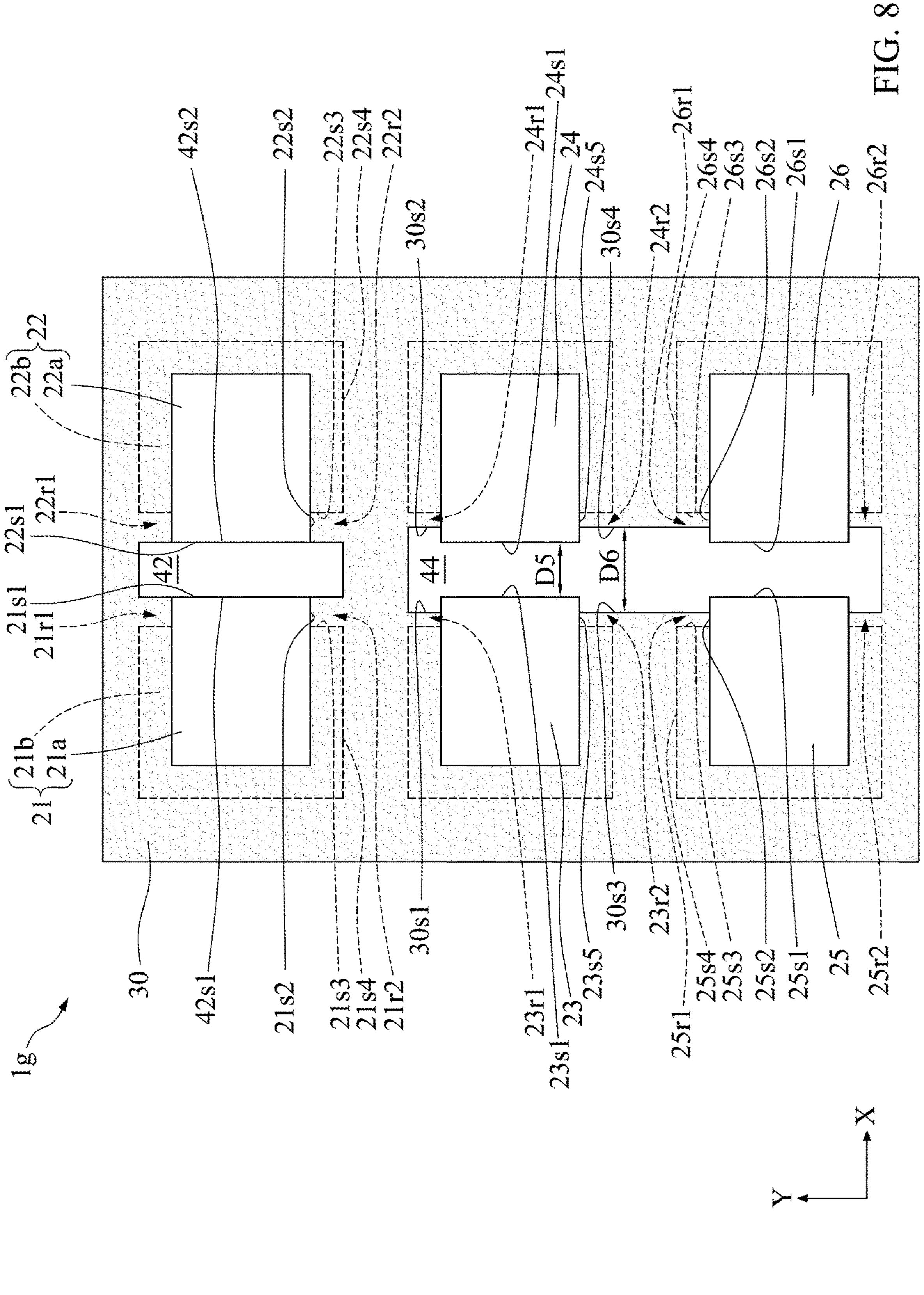
FIG. 8 is a top view of an electronic device, in accordance with an embodiment of the present disclosure.

FIG. 8 is a top view of an electronic device 1*g*, in accordance with an embodiment of the present disclosure. The electronic device 1*g* is similar to the electronic device 1*f* as shown in FIG. 7, and the differences therebetween are described below.

In some embodiments, the pattern of the insulation layer 30 may have a shift, which causes the trench 44 to have an uneven dimension (e.g., width) along the X direction. In some embodiments, the insulation layer 30 may have a surface 30*s*3 (or a lateral surface) between the pads 23 and 25 and a surface 30*s*4 (or a lateral surface) between the pads 24 and 26. The surface 30*s*3 may be misaligned with the surface 30*s*1 of the insulation layer 30. The surface 30*s*4 may be misaligned with the surface 30*s*2 of the insulation layer 30. In some embodiments, the insulation layer 30 is recessed relative to the pad 23, 24, 25, or 26 along the X direction.

The trench 44 may have a width D5 between the pads 23 and 24 (or between the pads 25 and 26) along the X direction, which may be defined by a distance between the surface 23*s*1 of the pads 23 and the surface 24*s*1 of the pad 24. The trench 44 may have a width D6 between a portion of the insulation layer 30 between the pads 23 and 25 and another portion of the insulation layer 30 between the pads 24 and 26 along the X direction. The width D6 may be defined by a distance between the surfaces 30*s*3 and 30*s*4 of the insulation layer 30. In some embodiments, the width D5 is less than the width D6. In some embodiments, a portion of the surface 23*s*5 of the pad 23 may be exposed to the trench 44. In some embodiments, a portion of the surface 24*s*5 of the pad 24 may be exposed to the trench 44. In some embodiments, a portion of the surface 25*s*3 of the pad 25 may be exposed to the trench 44. In some embodiments, a portion of the surface 26*s*3 of the pad 26 may be exposed to the trench 44. In some embodiments, the surface 23*s*1 of the pad 23 may be misaligned with the surface 30*s*3 of the insulation layer 30 in a top view. In some embodiments, the surface 24*s*1 of the pad 24 may be misaligned with the surface 30*s*4 of the insulation layer 30 in a top view. The trench 44 exposes the edge (e.g., the surface 24*s*1) of the pad 24. The outline of the trench 44 may be recessed relative to the edge (e.g., the surface 24*s*1) of the pad 24 along the X direction.

Figure 9:
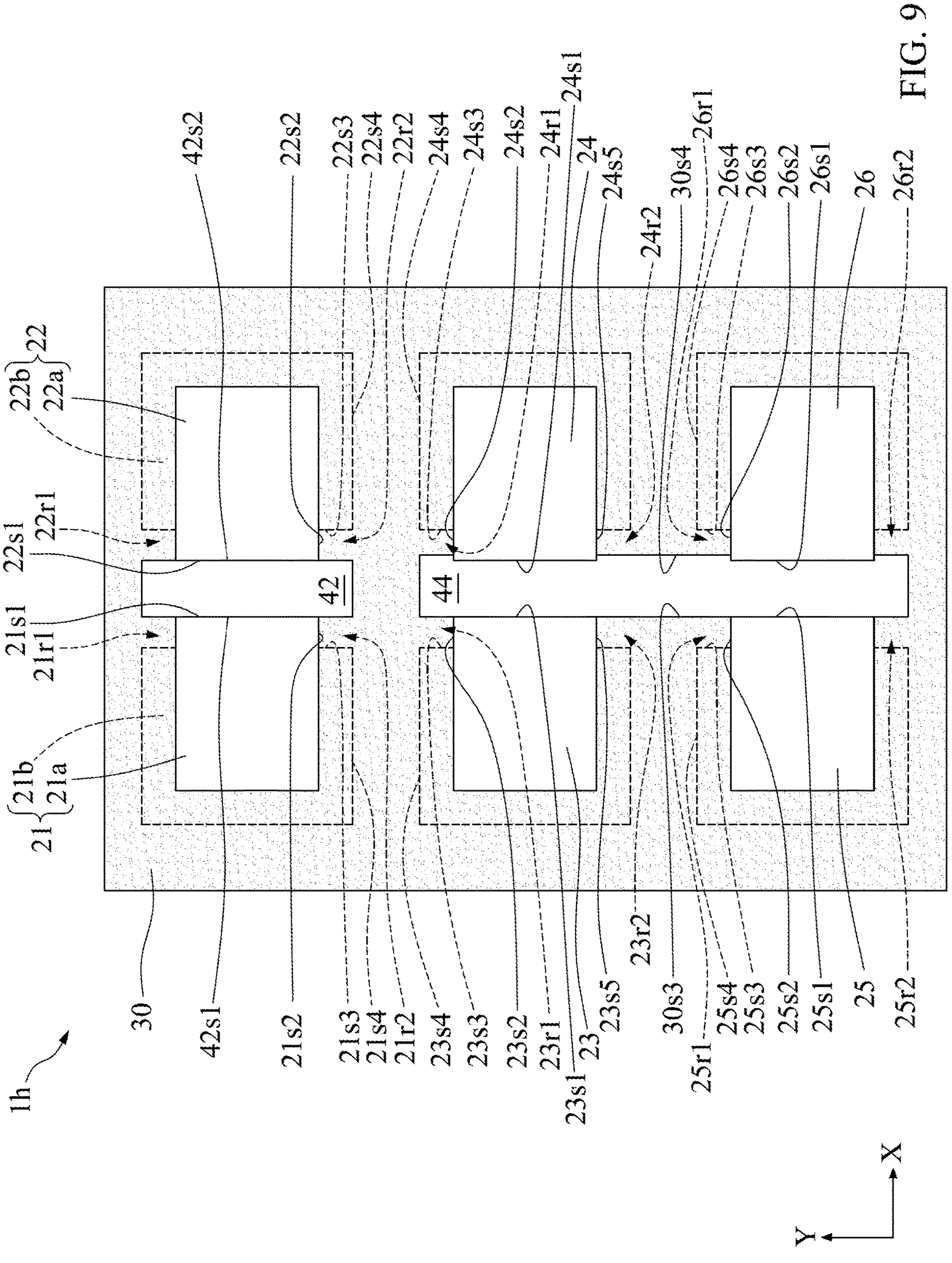
FIG. 9 is a top view of an electronic device, in accordance with an embodiment of the present disclosure.

FIG. 9 is a top view of an electronic device 1*h*, in accordance with an embodiment of the present disclosure. The electronic device 1*h* is similar to the electronic device 1*g* as shown in FIG. 8, and the differences therebetween are described below.

In some embodiments, the surface 23*s*5 of the pad 23 may be completely covered by the insulation layer 30. A first portion of the surface 24*s*5 of the pad 24 may be exposed by the insulation layer 30, and a second portion of the surface 24*s*5 of the pad 24 may be covered by the insulation layer 30. In some embodiments, the length of surface 24*s*5 exposed by the insulation layer 30 (e.g., the first portion) may be less than length of surface 24*s*5 covered by the insulation layer 30 (e.g., the second portion) along the X direction. In some embodiments, a portion of the pad 24 (or 26) is disposed within the trench 44.

Figure 10:
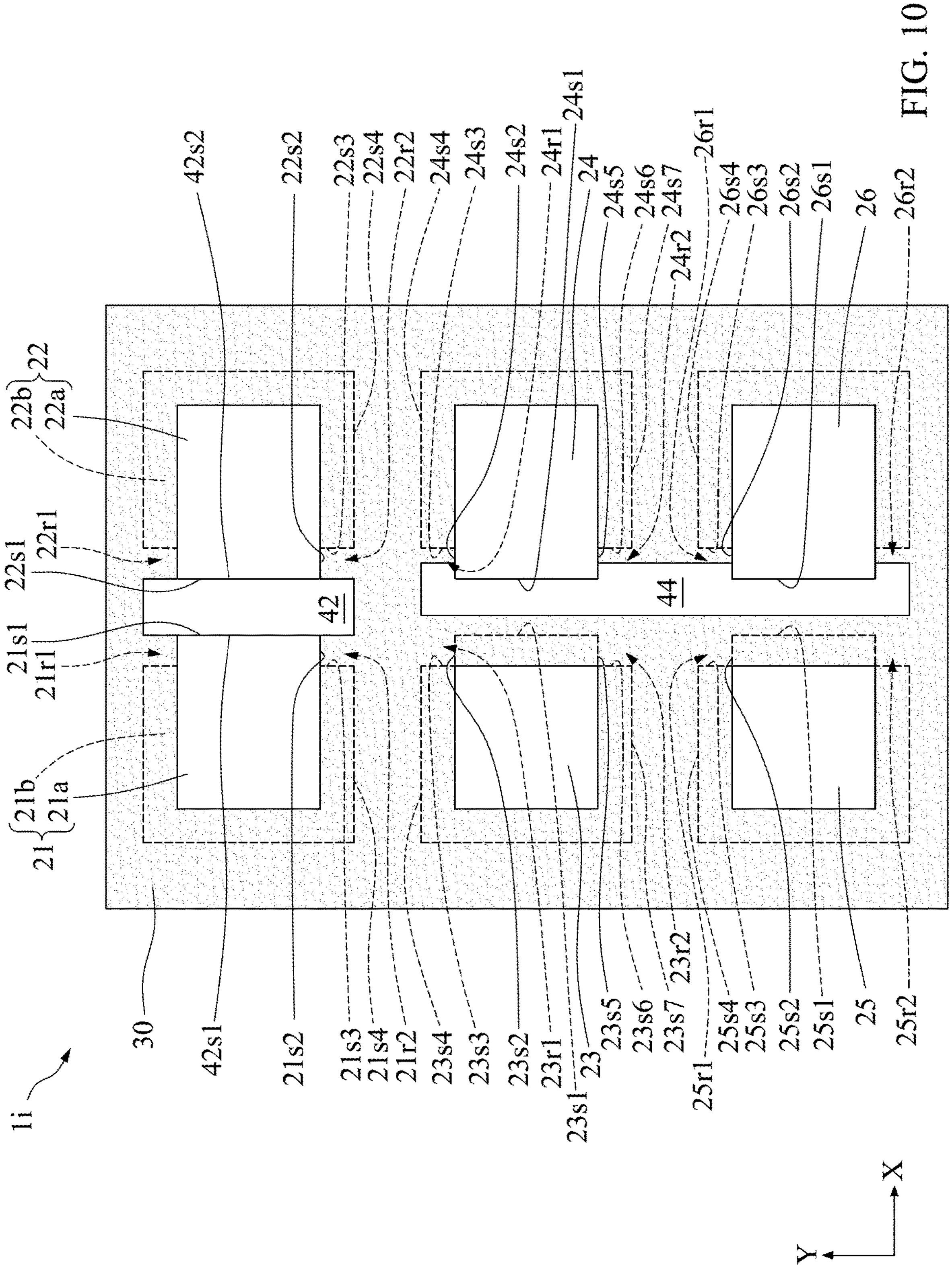
FIG. 10 is a top view of an electronic device, in accordance with an embodiment of the present disclosure.

FIG. 10 is a top view of an electronic device 1*i*, in accordance with an embodiment of the present disclosure. The electronic device 1*i* is similar to the electronic device 1*g* as shown in FIG. 8, and the differences therebetween are described below.

In some embodiments, the surface 23*s*1 of the pad 23 may be covered by the insulation layer 30. In some embodiments, the surface 25*s*1 of the pad 23 may be covered by the insulation layer 30. In some embodiments, a portion of the insulation layer 30 may be disposed within the trench 44. In some embodiments, a portion of the insulation layer 30 may be disposed between the pads 23 and 24. In some embodiments, a portion of the insulation layer 30 may be disposed between the pads 25 and 26. A portion of the indentation 24*r*2 of the pad 24 may be exposed to the trench 44. A portion of the indentation 24*r*2 of the pad 24 may be in communication with the trench 44. A portion of the indentation 26*r*1 of the pad 26 may be exposed to the trench 44. A portion of the indentation 26*r*1 of the pad 26 may be in communication with the trench 44. In some embodiments, a surface area of the pad 23 exposed by the insulation layer 30 is different from a surface area of the pad 24 exposed by the insulation layer 30. The length of the pad 23 may be substantially equal to the length of the pad along the Y direction.

Figure 11:
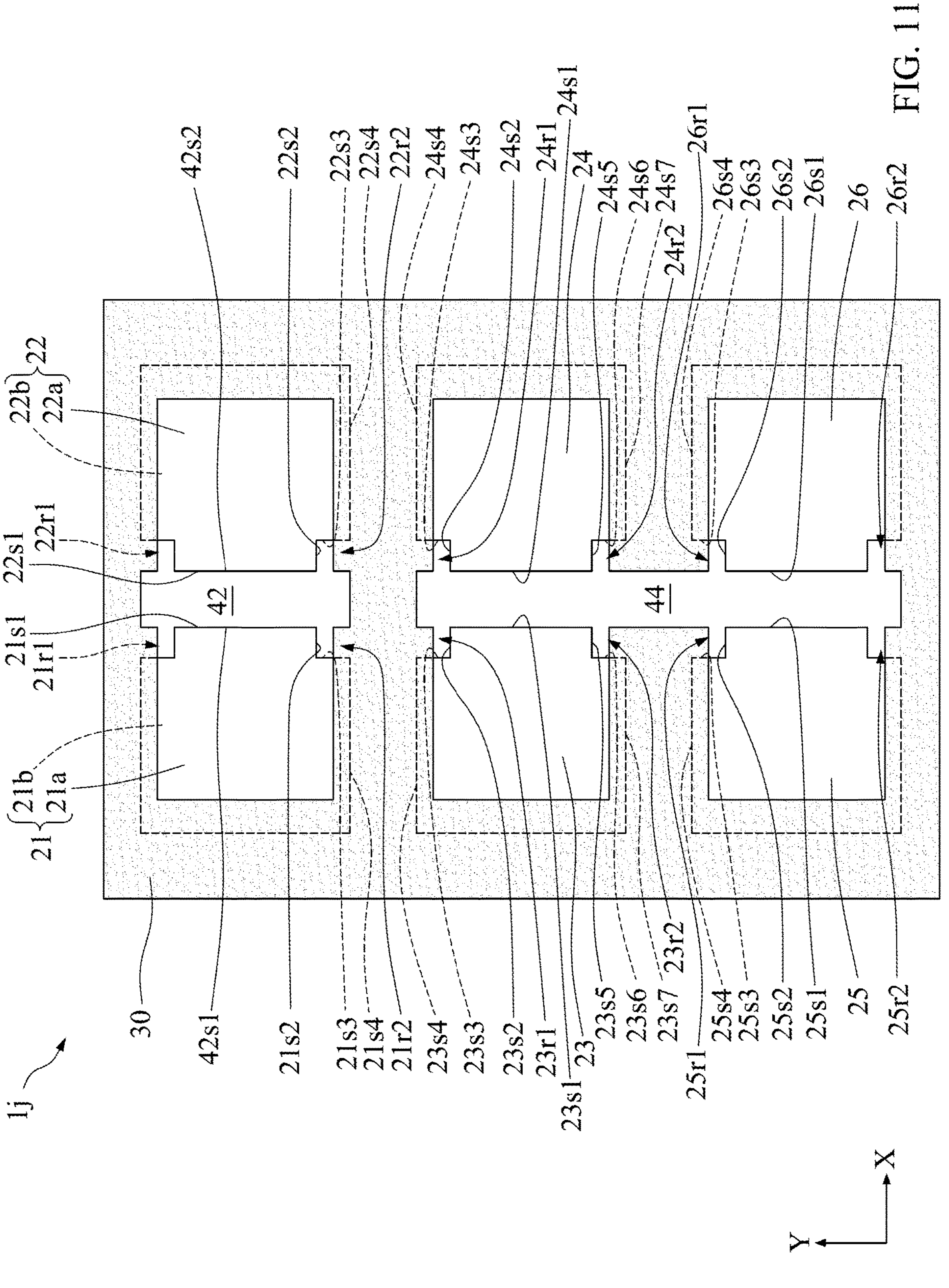
FIG. 11 is a top view of an electronic device, in accordance with an embodiment of the present disclosure.

FIG. 11 is a top view of an electronic device 1*j*, in accordance with an embodiment of the present disclosure. The electronic device 1*j* is similar to the electronic device 1*f* as shown in FIG. 7, and the differences therebetween are described below.

In some embodiments, the pattern of the insulation layer 30 may have a shift, which causes that the trench 42 to have an uneven dimension (e.g., width) along the X direction. In some embodiments, the surface 21*s*2 of the pad 21 may be exposed by the insulation layer 30. In some embodiments, a portion of the surface 21*s*3 of the pad 21 may be exposed by the insulation layer 30. In some embodiments, the surface 22*s*2 of the pad 22 may be exposed by the insulation layer 30. In some embodiments, a portion of the surface 22*s*3 of the pad 22 may be exposed by the insulation layer 30. In some embodiments, the surface 21*s*2 of the pad 21 may be exposed to the trench 42. In some embodiments, a portion of the surface 21*s*3 of the pad 21 may be exposed to the trench 42. In some embodiments, the surface 22*s*2 of the pad 22 may be exposed to the trench 42. In some embodiments, a portion of the surface 22*s*3 of the pad 22 may be exposed to the trench 42. In some embodiments, a portion of the indentation 21*r*2 of the pad 21 may be free of being covered by the insulation layer 30. In some embodiments, a portion of the indentation 22*r*2 of the pad 22 may be free of being covered by the insulation layer 30.

FIG. 12A to FIG. 12J illustrate various stages of an example of a method for manufacturing an electronic device according to some embodiments of the present disclosure.

Figure 12A:
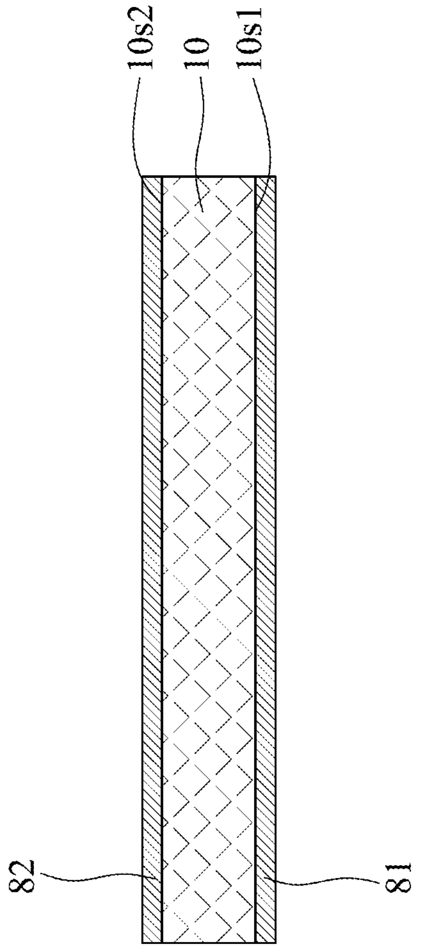
FIG. 12A illustrates one or more stages of an example of a method for manufacturing an electronic device according to some embodiments of the present disclosure.

Referring to FIG. 12A, a carrier 10 may be provided. The carrier 10 may have a surface 10*s*1 and a surface 10*s*2 opposite to the surface 10*s*1. A conductive material 81 may be formed on or under the surface 10*s*1 of the carrier 10. A conductive material 82 may be formed on or over the surface 10*s*2 of the carrier 10. Each of the conductive material 81 and conductive material 82 may include copper (Cu), aluminum (Al), tungsten (W), titanium (Ti), tantalum (Ta), or other applicable materials.

Figure 12B:
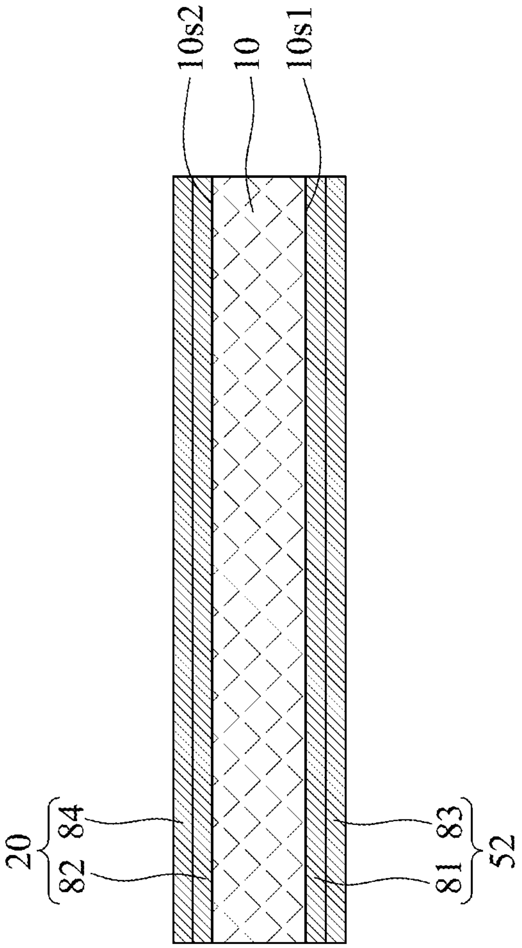
FIG. 12B illustrates one or more stages of an example of a method for manufacturing an electronic device according to some embodiments of the present disclosure.

Referring to FIG. 12B, a conductive material 83 may be formed on or under the conductive material 81. A conductive material 84 may be formed on or over the conductive material 82. In some embodiments, an electroplating technique or other suitable techniques may be performed to form the conductive material 83 and conductive material 84. In some embodiments, there is a nonobvious boundary or no boundary between the conductive material 81 and conductive material 83, and the conductive material 81 and conductive material 83 may be collectively defined as a conductive layer 52. In some embodiments, there is a nonobvious boundary or no boundary between the conductive material 82 and conductive material 84, and the conductive material 82 and conductive material 84 may be collectively defined as a conductive layer 20.

Figure 12C:
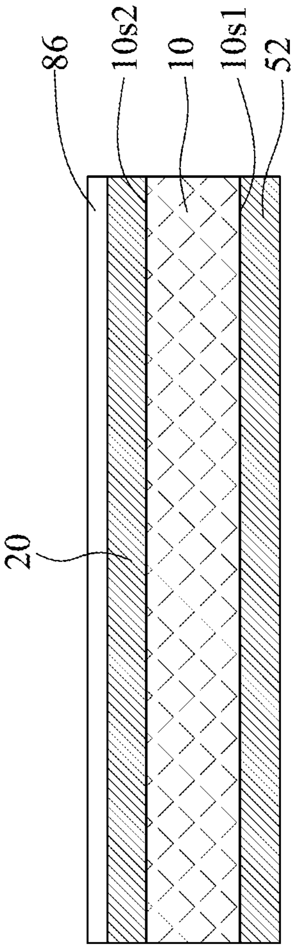
FIG. 12C illustrates one or more stages of an example of a method for manufacturing an electronic device according to some embodiments of the present disclosure.

Referring to FIG. 12C, a mask 86 may be formed on or over the surface 10*s*2 of the carrier 10. The mask 86 may cover the conductive layer 20. The mask 86 may include a photosensitive material or other suitable materials.

Figure 12D:
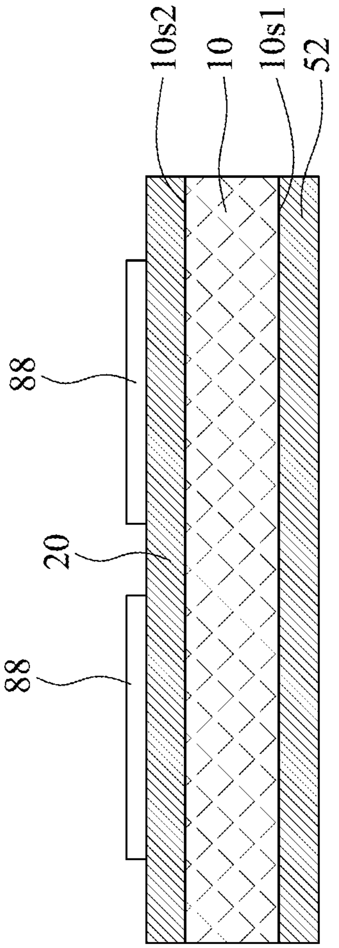
FIG. 12D illustrates one or more stages of an example of a method for manufacturing an electronic device according to some embodiments of the present disclosure.

Referring to FIG. 12D, the mask 86 may be patterned to define a pattern 88 over the conductive layer 20. The pattern 88 may be configured to define the patterns of pads.

Figure 12E:
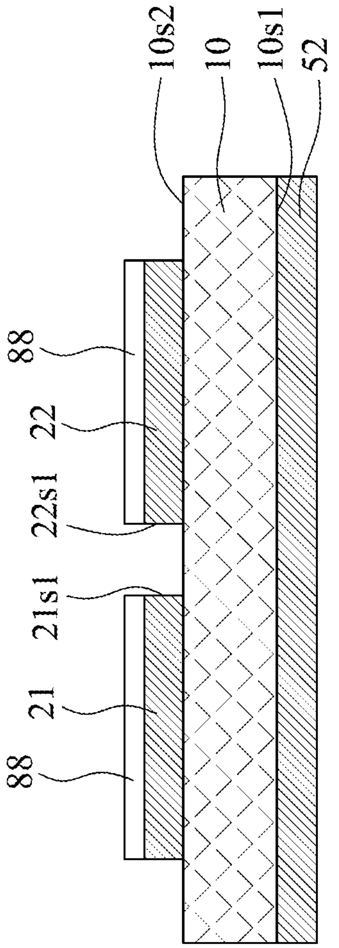
FIG. 12E illustrates one or more stages of an example of a method for manufacturing an electronic device according to some embodiments of the present disclosure.

Referring to FIG. 12E, the conductive layer 20 may be patterned to form the pads 21 and 22. Although not shown in FIG. 12D and FIG. 12E, the pattern 88 may have multiple segments, and each of the segments may have indentations at the corner thereof. The pads 21 and 22 may inherit the profile of the pattern 88. Thus, the pads 21 and 22 may have indentations as shown in FIG. 1C and FIG. 1D.

Figure 12F:
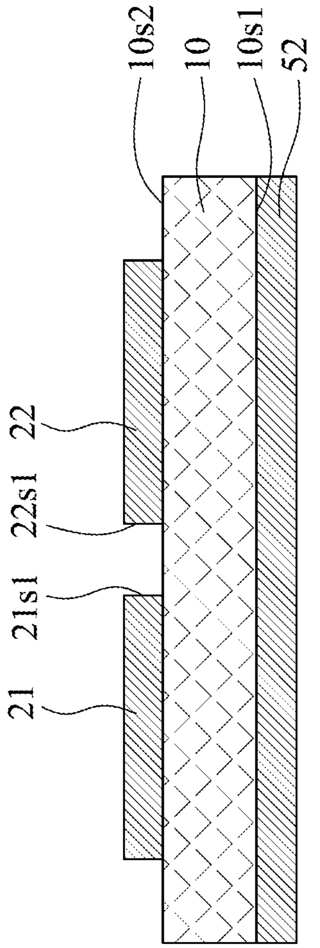
FIG. 12F illustrates one or more stages of an example of a method for manufacturing an electronic device according to some embodiments of the present disclosure.

Referring to FIG. 12F, the pattern 88 may be removed. The pads 21 and 22 may be exposed.

Figure 12G:
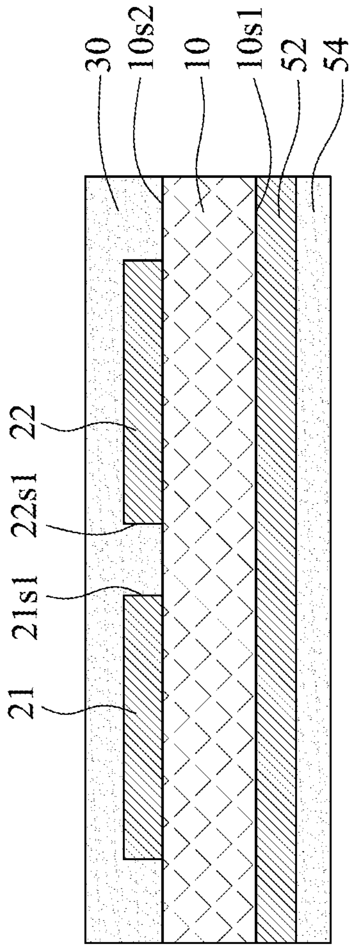
FIG. 12G illustrates one or more stages of an example of a method for manufacturing an electronic device according to some embodiments of the present disclosure.

Referring to FIG. 12G, an insulation layer 30 may be formed on or over the surface 10*s*2 of the carrier 10. An insulation layer 54 may be formed on or under the surface 10*s*1 of the carrier 10. The insulation layer 30 may cover the pads 21 and 22.

Figure 12H:
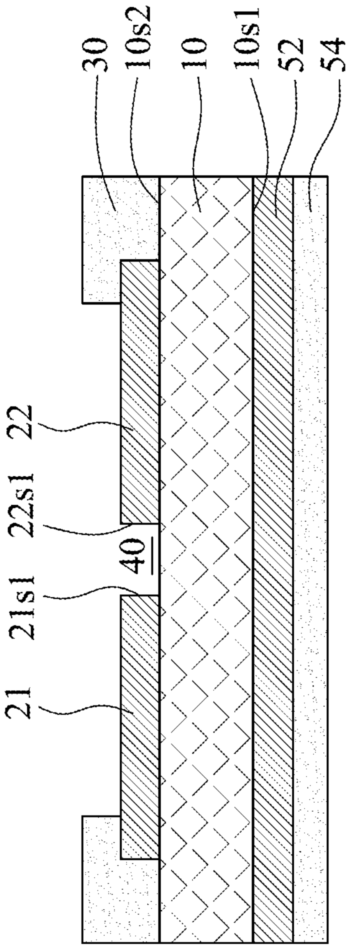
FIG. 12H illustrates one or more stages of an example of a method for manufacturing an electronic device according to some embodiments of the present disclosure.

Referring to FIG. 12H, the insulation layer 30 may be patterned to expose a portion of the pad 21 and a portion of the pad 22. A trench 40 may be defined between the pads 21 and 22 and over the surface 10*s*2 of the carrier 10.

Figure 12I:
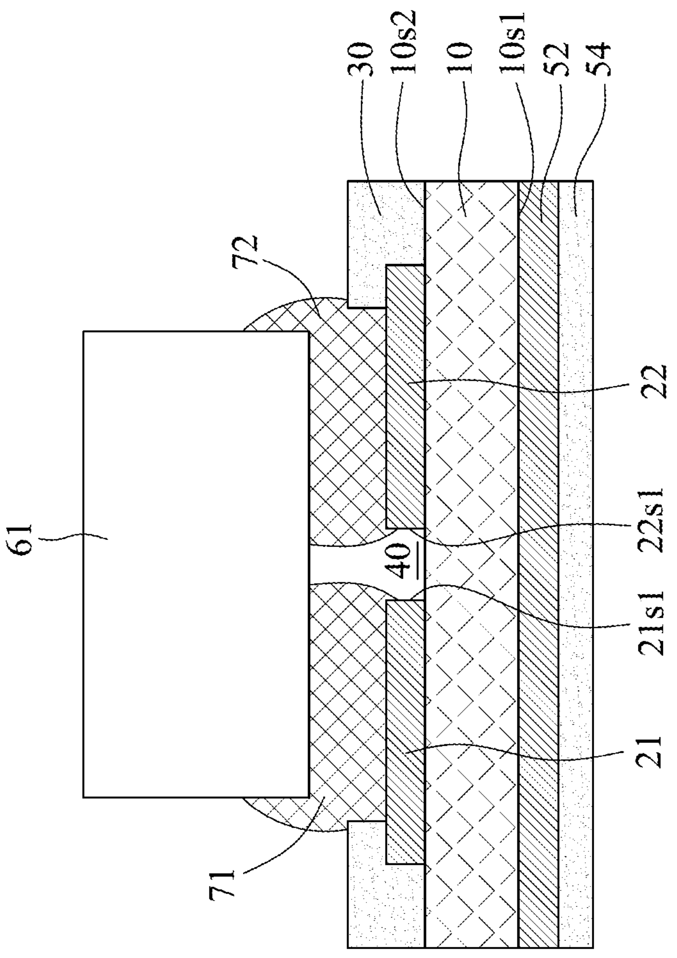
FIG. 12I illustrates one or more stages of an example of a method for manufacturing an electronic device according to some embodiments of the present disclosure.

Referring to FIG. 12I, an electrical connector 71 and an electrical connector 72 may be formed on the pads 21 and 22, respectively. An electronic component 61 may be formed on the electrical connectors 71 and 72.

Figure 12J:
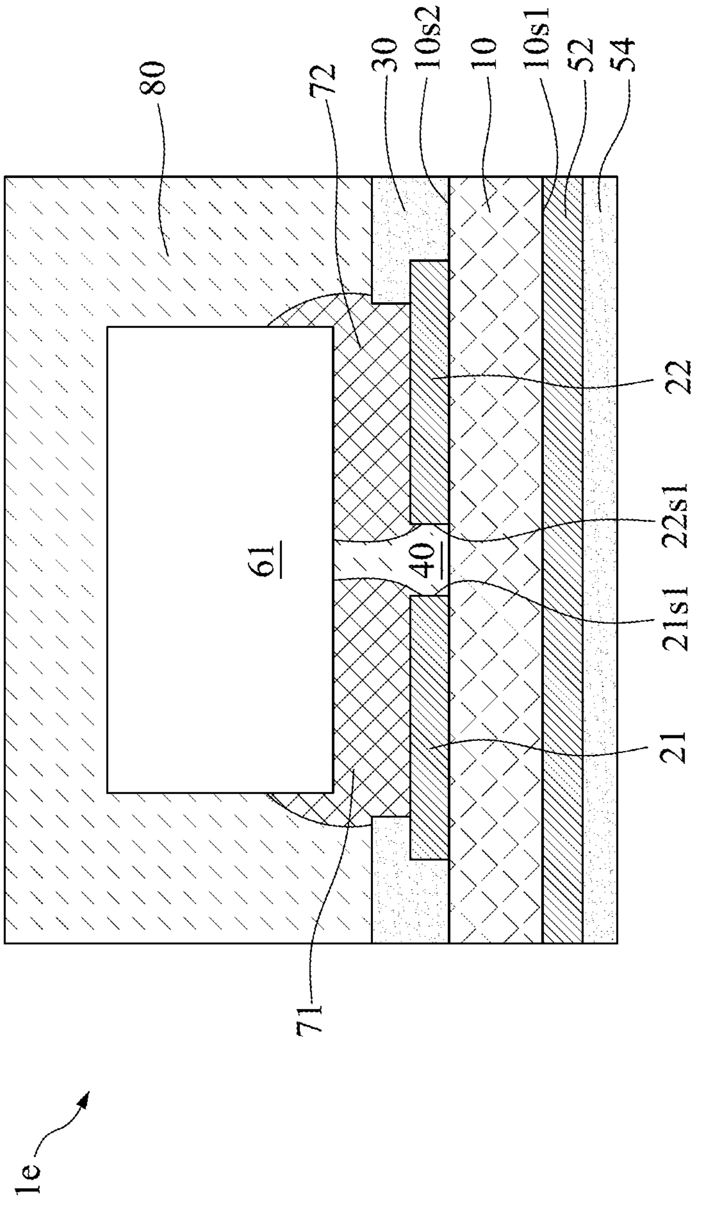
FIG. 12J illustrates one or more stages of an example of a method for manufacturing an electronic device according to some embodiments of the present disclosure.

Referring to FIG. 12J, an encapsulant 80 may be formed on or over the surface 10*s*2 of the carrier 10. The encapsulant 80 may encapsulate the electronic component 61, the electrical connector 71, and the electrical connector 72. As a result, an electronic device (e.g., the electronic device 1*e* as shown in FIG. 6) may be produced.

Figure 13:
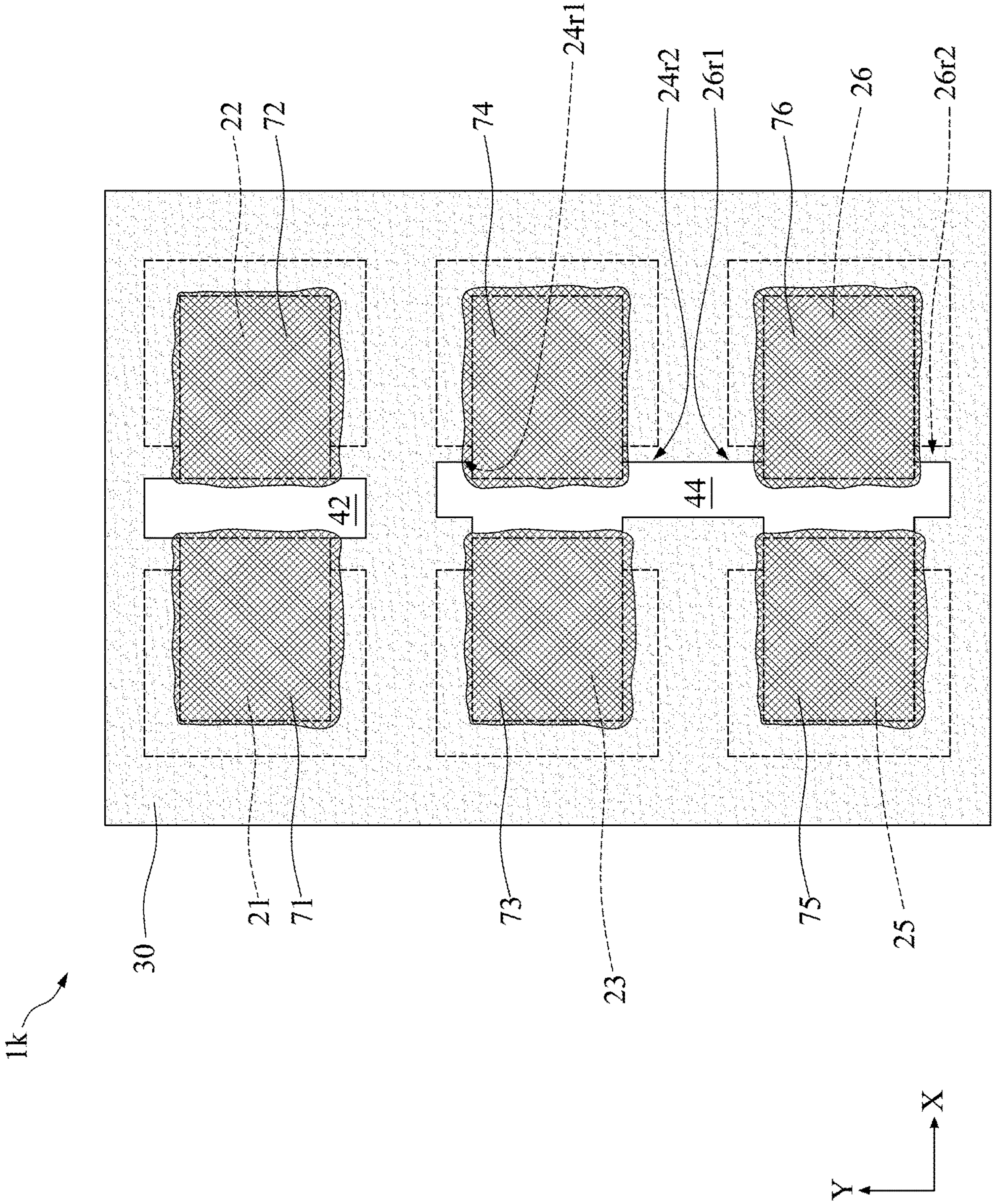
FIG. 13 is a top view of an electronic device, in accordance with an embodiment of the present disclosure.

FIG. 13 is a top view of an electronic device 1*k*, in accordance with an embodiment of the present disclosure. In some embodiments, the electronic device 1*k* may include electrical connectors 71, 72, 73, 74, 75, and 76. The electrical connector 75 may be disposed on or over the pad 25. The electrical connector 76 may be disposed on or over the pad 26. In some embodiments, the lateral surface (or sidewall) of the electrical connectors 71, 72, 73, 74, 75, and 76 may be roughness. In some embodiments, the electrical connector 74 may have a protruded profile protruding along the Y direction within the indentation 24*r*1.

In some embodiments, the indentation (e.g., 24*r*1, 24*r*2, 26*r*1, and 26*r*2) may be configured to increase the path of the reflowable material (e.g., the material configured to form the electrical connectors 71, 72, 73, 74, 75, and 76, which can also be referred to as a reflowable conductive material) along the bleeding (or flowing) direction (e.g., the Y direction). The barrier structure (e.g., indentations 24*r*1, 24*r*2, 26*r*1, and 26*r*2) may be defined by a plurality of abutting edges of the pad (e.g., the pads 21 to 24) and configured to block a flowing path, in a bleeding direction (e.g., the direction from the pad 22 to pad 24), of a reflowable conductive material. Even if the amount of reflowable material coated on the pads (e.g, pads 24 and 26) are relatively great, the reflowable material can bleed or flow onto the indentations (e.g., 24*r*2 and 26*r*1) rather than on the surfaces 24*s*7 and 26*s*4. As a result, the distance between the electrical connectors (e.g., the electrical connectors 74 and 76) increases, which prevents the electrical connectors (e.g., the electrical connectors 74 and 76) from short.

Figure 14:
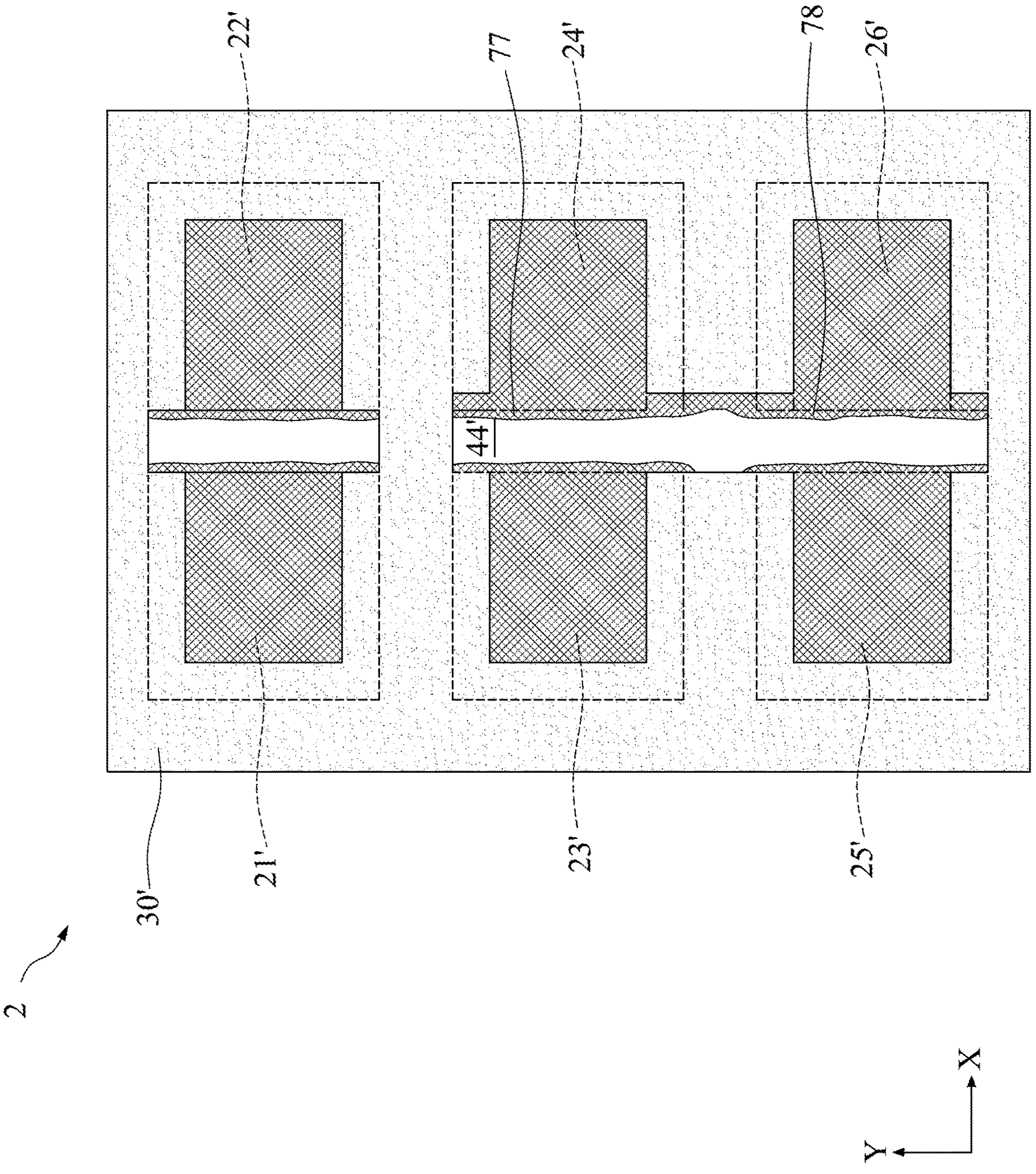
FIG. 14 is a top view of an electronic device of a comparative example.

FIG. 14 is a top view of an electronic device 2 of a comparative example. The electronic device 2 may include pads 21', 22', 23', 24', 25' and 26'. The pads 21', 22', 23', 24', 25' and 26' are designed without indentations (or barrier structures). An insulation layer 30' covers a portion of the pads 21', 22', 23', 24', 25' and 26'. The pattern of the insulation layer 30' may have a shift. As a result, the lateral surface (or sidewall), which face each other, of the pads 24' and 26' are exposed to the trench 44'. The electronic device 2 includes reflowable materials 77 and 78. The reflowable material 77 is disposed on the pad 24'. The reflowable material 78 is disposed on the pad 26'. In some cases, the amount of a reflowable material is significantly high, leading to the bridging of reflowable materials 77 and 78 along the bleeding direction due to the absence of barrier structures that would otherwise extend the bleeding path of the reflowable materials.

In some embodiments, an electronic device includes a substrate, a first pad, and a second pad. The substrate defines a trench extending along a first direction. The first pad is disposed adjacent to the trench. The second pad is disposed next to the first pad. The first pad and the second pad are disposed at a same side of the trench and are arranged along the first direction. The first pad and the second pad define a first gap and a second gap therebetween along the first direction. The first gap is closer to the trench than the second gap is. A width of the first gap along the first direction is greater than a width of the second gap along the first direction.

In some embodiments, the substrate includes an insulation layer partially covering the first pad and partially covering the second pad, and the insulation layer defines an outline of the trench, and wherein the trench exposes a first edge of the first pad and, in a top view perspective, the outline of the trench is recessed relative to the first edge of the first pad along a second direction substantially perpendicular to the first direction.

In some embodiments, the first pad includes a first recessed portion connected to the first edge, and the first recessed portion has a lateral surface extending along the second direction and including a first portion exposed from the insulation layer and disposed within the trench.

In some embodiments, the lateral surface of the first recessed portion further includes a second portion covered by the insulation layer, and a length of the second portion is greater than a length of the first portion.

In some embodiments, in a top view, the first pad and the second pad extend into the trench.

In some embodiments, the electronic device further includes a third pad spaced apart from the first pad by the trench. The substrate includes an insulation layer partially covering the first pad, partially covering the third pad, and defining an outline of the trench, and wherein a first area of the first pad exposed by the trench is different from a third area of the third pad exposed by the trench from a top view.

In some embodiments, a length of the first area is substantially equal to a length of the third area along the first direction.

In some embodiments, an electronic device includes a substrate, a first pad, a second pad, and a first barrier structure. The substrate defines a trench extending along a first direction. The first pad is disposed adjacent to the trench. The second pad is disposed next to the first pad. The first pad and the second pad are disposed at a first side of the trench. The first barrier structure is defined by a plurality of abutting edges of the first pad and configured to block a flowing path, in a bleeding direction from the first pad to the second pad, of a reflowable conductive material. The first barrier structure overlaps the first pad along a direction substantially perpendicular to the bleeding direction in a top view.

In some embodiments, the first barrier structure overlaps the second pad along the bleeding direction.

In some embodiments, the substrate includes an insulation layer over the first barrier structure.

In some embodiments, the insulation layer covers a lateral surface of the first barrier structure.

In some embodiments, the electronic device further includes a third pad spaced apart from the first pad by the trench, wherein the first pad and the third pad are collectively configured to be electrically connected to an electronic component.

In some embodiments, the electronic device further includes a fourth pad disposed adjacent to the trench and next to the third pad, wherein the third pad and the fourth pad are disposed at a second side of the trench. A second barrier structure defined by a plurality of abutting edges of the third pad and configured to block a flowing path, in a bleeding direction from the third pad to the fourth pad, of a second reflowable conductive material.

In some embodiments, the electronic device further includes an electronic component connected to the first pad and the third pad, wherein the electronic component is free from overlapping a portion the first barrier structure in a top view.

In some embodiments, the first pad further includes a second barrier structure, and the first barrier structure and the second barrier structure are asymmetrical with respect to a central axis of the first pad extending in a second direction perpendicular to the first direction.

In some embodiments, a length of the first barrier structure is different from a length of the second barrier structure along the bleeding direction.

In some embodiments, an electronic device includes a substrate, a first terminal, a second terminal, a first reflowable material, and a second reflowable material. The substrate defines a trench extending along a first direction. The first terminal abuts the trench. The second terminal is disposed next to the first terminal. The first terminal and the second terminal are disposed at a same side of the trench and are arranged along the first direction. The first terminal and the second terminal define a first gap and a second gap therebetween along the first direction. The first gap is closer to the trench than the second gap is. The first reflowable material is on a lateral surface, extending along the first direction, of the first terminal. The second reflowable material is on a lateral surface, extending along the first direction, of the second terminal. A distance between the first reflowable material and the second reflowable material ranges between a width of the first gap and a width of the second gap along the first direction.

In some embodiments, a lateral surface, exposed to the trench, of the first reflowable material has a length greater than the lateral surface of the first terminal along the first direction.

In some embodiments, in a cross-sectional view, the substrate includes an insulation layer defining the trench, and a portion of the first reflowable material is disposed on a sidewall, which faces the trench, of the insulation layer.

In some embodiments, the first reflowable material includes two opposite end portions along the first direction, and one of the two opposite end portions has a convex surface from a top view.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only and that practical implementations of the structures described herein can be spatially arranged in any orientation or manner, provided that the merits of arrangements of this disclosure are not deviated from by such an arrangement.

As used herein the term "active surface" may refer to a surface of an electronic component or passive element on which contact terminals such as contact pads are disposed.

As used herein, the term "vertical" is used to refer to upward and downward directions, whereas the term "horizontal" refers to directions transverse to the vertical directions.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no exceeding 5 μm, no exceeding 2 μm, no exceeding 1 μm, or no exceeding 0.5 μm. A surface can be deemed to be substantially flat if a displacement between the highest point and the lowest point of the surface is no exceeding 5 μm, no exceeding 2 μm, no exceeding 1 μm, or no exceeding 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity exceeding approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific arrangements thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other arrangements of the present disclosure which are not specifically illustrated. The specification and drawings are to be regarded as illustrative rather than restrictive. Modifications may be made to adapt a particular situation, material, composition of matter, method, or process to the objective, spirit, and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:

a substrate defining a trench extending along a first direction;

a first pad disposed adjacent to the trench; and a second pad disposed next to the first pad, wherein the first pad and the second pad are disposed at a same side of the trench, and are arranged along the first direction, wherein the first pad and the second pad define a first gap and a second gap therebetween along the first direction, the first gap is closer to the trench than the second gap is, and a width of the first gap along the first direction is greater than a width of the second gap along the first direction.

2. The electronic device of claim 1, wherein the substrate includes an insulation layer partially covering the first pad and partially covering the second pad, and the insulation layer defines an outline of the trench, and wherein the trench exposes a first edge of the first pad and, in a top view perspective, the outline of the trench is recessed relative to the first edge of the first pad along a second direction substantially perpendicular to the first direction.

3. The electronic device of claim 2, wherein the first pad includes a first recessed portion connected to the first edge, and the first recessed portion has a lateral surface extending along the second direction and including a first portion exposed from the insulation layer and disposed within the trench.

4. The electronic device of claim 3, wherein the lateral surface of the first recessed portion further includes a second portion covered by the insulation layer, and a length of the second portion is greater than a length of the first portion.

5. The electronic device of claim 1, wherein in a top view, the first pad and the second pad extend into the trench.

6. The electronic device of claim 1, further comprising:

a third pad spaced apart from the first pad by the trench, wherein the substrate includes an insulation layer partially covering the first pad, partially covering the third pad, and defining an outline of the trench, and wherein a first area of the first pad exposed by the trench is different from a third area of the third pad exposed by the trench from a top view.

7. The electronic device of claim 6, wherein a length of the first area is substantially equal to a length of the third area along the first direction.

8. An electronic device, comprising:

a substrate defining a trench extending along a first direction;

a first pad disposed adjacent to the trench;

a second pad disposed next to the first pad, wherein the first pad and the second pad are disposed at a first side of the trench; and a first barrier structure defined by a plurality of abutting edges of the first pad and configured to block a flowing path, in a bleeding direction from the first pad to the second pad, of a reflowable conductive material, and the first barrier structure overlaps the first pad along a direction substantially perpendicular to the bleeding direction in a top view.

9. The electronic device of claim 8, wherein the first barrier structure overlaps the second pad along the bleeding direction.

10. The electronic device of claim 8, wherein the substrate includes an insulation layer over the first barrier structure.

11. The electronic device of claim 10, wherein the insulation layer covers a lateral surface of the first barrier structure.

12. The electronic device of claim 8, further comprising:

a third pad spaced apart from the first pad by the trench, wherein the first pad and the third pad are collectively configured to be electrically connected to an electronic component.

13. The electronic device of claim 12, further comprising:

a fourth pad disposed adjacent to the trench and next to the third pad, wherein the third pad and the fourth pad are disposed at a second side of the trench; and a second barrier structure defined by a plurality of abutting edges of the third pad and configured to block a flowing path, in a bleeding direction from the third pad to the fourth pad, of a second reflowable conductive material.

14. The electronic device of claim 12, wherein the electronic component is free from overlapping a portion the first barrier structure in a top view.

15. The electronic device of claim 8, wherein the first pad further includes a second barrier structure, and the first barrier structure and the second barrier structure are asymmetrical with respect to a central axis of the first pad extending in a second direction perpendicular to the first direction.

16. The electronic device of claim 15, wherein a length of the first barrier structure is different from a length of the second barrier structure along the bleeding direction.

17. An electronic device, comprising:

a substrate defining a trench extending along a first direction;

a first terminal abutting the trench;

a second terminal disposed next to the first terminal, wherein the first terminal and the second terminal are disposed at a same side of the trench, and are arranged along the first direction, wherein the first terminal and the second terminal define a first gap and a second gap therebetween along the first direction, and the first gap is closer to the trench than the second gap is;

a first reflowable material on a lateral surface, extending along the first direction, of the first terminal; and a second reflowable material on a lateral surface, extending along the first direction, of the second terminal, wherein a distance between the first reflowable material and the second reflowable material ranges between a width of the first gap and a width of the second gap along the first direction.

18. The electronic device of claim 17, wherein a lateral surface, exposed to the trench, of the first reflowable material has a length greater than the lateral surface of the first terminal along the first direction.

19. The electronic device of claim 18, wherein in a cross-sectional view, the substrate includes an insulation layer defining the trench, and a portion of the first reflowable material is disposed on a sidewall, which faces the trench, of the insulation layer.

20. The electronic device of claim 18, wherein the first reflowable material includes two opposite end portions along the first direction, and one of the two opposite end portions has a convex surface from a top view.

* * * * *